US008105867B2

(12) United States Patent
Matamis et al.

(10) Patent No.: US 8,105,867 B2
(45) Date of Patent: Jan. 31, 2012

(54) SELF-ALIGNED THREE-DIMENSIONAL NON-VOLATILE MEMORY FABRICATION

(75) Inventors: George Matamis, San Jose, CA (US); Henry Chien, San Jose, CA (US); James K Kai, Santa Clara, CA (US); Takashi Orimoto, Sunnyvale, CA (US); Vinod R Purayath, Santa Clara, CA (US); Er-Xuan Ping, Fremont, CA (US); Roy E Scheuerlein, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 12/468,717

(22) Filed: May 19, 2009

(65) Prior Publication Data

US 2010/0124813 A1 May 20, 2010

Related U.S. Application Data

(60) Provisional application No. 61/115,913, filed on Nov. 18, 2008.

(51) Int. Cl.
*H01L 21/00* (2006.01)
(52) U.S. Cl. .................. 438/95; 438/569; 257/E21.661; 257/E21.662; 257/E21.295; 216/6; 216/51
(58) Field of Classification Search .................. 438/95, 438/740, 748, 397, 669; 257/E21.662, E21.667, 257/E21.661, E21.09, E21.295; 216/6, 51, 216/72
See application file for complete search history.

(56) References Cited

U.S. PATENT DOCUMENTS

| 5,835,396 | A | 11/1998 | Zhang |
| 6,034,882 | A * | 3/2000 | Johnson et al. ............... 365/103 |
| 6,356,477 | B1 | 3/2002 | Tran |
| 6,420,215 | B1 | 7/2002 | Knall et al. |
| 6,515,888 | B2 | 2/2003 | Johnson et al. |

(Continued)

FOREIGN PATENT DOCUMENTS

EP 0117045 A 8/1984

OTHER PUBLICATIONS

U.S. Appl. No. 12/344,022, filed Dec. 24, 2008.

(Continued)

*Primary Examiner* — Caridad Everhart
(74) *Attorney, Agent, or Firm* — Vierra Magen Marcus & DeNiro LLP

(57) ABSTRACT

A self-aligned fabrication process for three-dimensional non-volatile memory is disclosed. A double etch process forms conductors at a given level in self-alignment with memory pillars both underlying and overlying the conductors. Forming the conductors in this manner can include etching a first conductor layer using a first repeating pattern in a given direction to form a first portion of the conductors. Etching with the first pattern also defines two opposing sidewalls of an underlying pillar structure, thereby self-aligning the conductors with the pillars. After etching, a second conductor layer is deposited followed by a semiconductor layer stack. Etching with a second pattern that repeats in the same direction as the first pattern is performed, thereby forming a second portion of the conductors that is self-aligned with overlying layer stack lines. These layer stack lines are then etched orthogonally to define a second set of pillars overlying the conductors.

21 Claims, 40 Drawing Sheets

U.S. PATENT DOCUMENTS

| | | |
|---|---|---|
| 6,525,953 B1 | 2/2003 | Johnson |
| 6,579,760 B1 | 6/2003 | Lung |
| 6,631,085 B2 | 10/2003 | Kleveland et al. |
| 6,642,603 B1 | 11/2003 | Knall |
| 6,777,773 B2 | 8/2004 | Knall |
| 6,780,652 B2 * | 8/2004 | Lee .................................. 438/3 |
| 6,951,780 B1 | 10/2005 | Herner |
| 6,952,043 B2 | 10/2005 | Vyvoda et al. |
| 6,984,561 B2 | 1/2006 | Herner et al. |
| 7,005,350 B2 | 2/2006 | Walker et al. |
| 7,022,572 B2 | 4/2006 | Scheuerlein et al. |
| 7,081,377 B2 | 7/2006 | Cleeves |
| 7,285,464 B2 | 10/2007 | Herner et al. |
| 7,582,529 B2 | 9/2009 | Matamis et al. |
| 7,592,223 B2 | 9/2009 | Pham et al. |
| 2002/0081833 A1 | 6/2002 | Li et al. |
| 2003/0016553 A1 | 1/2003 | Subramanian et al. |
| 2004/0002184 A1 | 1/2004 | Cleeves |
| 2004/0002186 A1 | 1/2004 | Vyvoda et al. |
| 2004/0016991 A1 | 1/2004 | Johnson et al. |
| 2005/0014322 A1 | 1/2005 | Herner et al. |
| 2005/0026334 A1 * | 2/2005 | Knall ............................ 438/128 |
| 2005/0242386 A1 | 11/2005 | Ang |
| 2006/0073657 A1 | 4/2006 | Herner et al. |
| 2006/0250836 A1 | 11/2006 | Herner et al. |
| 2008/0002456 A1 | 1/2008 | Toda et al. |
| 2008/0175031 A1 | 7/2008 | Park et al. |
| 2008/0248621 A1 | 10/2008 | Kai et al. |
| 2008/0290335 A1 | 11/2008 | Lin et al. |
| 2009/0309089 A1 | 12/2009 | Hsia et al. |

OTHER PUBLICATIONS

International Search Report & The Written Opinion of the International Searching Authority dated Dec. 21, 2009, International Application No. PCT/US2009/059052 filed Sep. 30, 2009.

International Preliminary Report on Patenability dated May 24, 2011, Patent Corporation Treaty, International Patent Application No. PCT/US2009/059052.

* cited by examiner

US 8,105,867 B2

SELF-ALIGNED THREE-DIMENSIONAL NON-VOLATILE MEMORY FABRICATION

CLAIM OF PRIORITY

The present application claims priority from U.S. Provisional Patent Application No. 61/115,913, entitled "SELF-ALIGNED STACKED MEMORY ARRAYS AND METHODS OF FORMING," by Matamis et al., filed Nov. 18, 2008, incorporated by reference herein in its entirety.

BACKGROUND OF THE INVENTION

1. Field of the Invention

Embodiments in accordance with the present disclosure are directed to integrated circuits containing non-volatile memory cell arrays and particularly those arrays incorporating passive element memory cells.

2. Description of the Related Art

Materials having a detectable level of change in state, such as a resistance or phase change, are used to form various types of non-volatile semiconductor based memory devices. For example, simple antifuses are used for binary data storage in one time field-programmable (OTP) memory arrays by assigning a lower resistance initial physical state of a memory cell to a first logical state such as logical '0,' and assigning a higher resistance physical state of the cell to a second logical state such as logical '1.' Some materials can have their resistance switched back in the direction of their initial resistance. These types of materials can be used to form re-writable memory cells. Multiple levels of detectable resistance in materials can further be used to form multi-state devices which may or may not be re-writable.

Materials having a memory effect such as a detectable level of resistance are often used as a state change element and placed in series with a steering element to form a memory cell. Diodes or other devices having a non-linear conduction current are typically used as the steering element. In many implementations, a set of word lines and bit lines are arranged in a substantially perpendicular configuration with a memory cell at the intersection of each word line and bit line. Two-terminal memory cells can be constructed at the intersections with one terminal (e.g., terminal portion of the cell or separate layer of the cell) in contact with the conductor forming the respective word line and another terminal in contactor with the conductor forming the respective bit line. Such cells are sometimes referred to as passive element memory cells.

Two-terminal memory cells with state change elements have been used in three-dimensional field programmable non-volatile memory arrays because of their more simple design when compared to other three-terminal memory devices such as flash EEPROM. Three-dimensional non-volatile memory arrays are attractive because of their potential to greatly increase the number of memory cells that can be fabricated in a given wafer area. In monolithic three-dimensional memories, multiple levels of memory cells can be fabricated above a single substrate, without intervening substrate layers.

One type of three-dimensional memory utilizes a rail-stack structure to form the memory cells. A rail stack is formed by creating successive layers of material which are etched together to form an aligned stack of layers. A memory cell may be formed at the intersection of two such rail stacks. The fabrication of rail-stack structures generally requires fewer mask layers and processing steps to implement an array than other memory structures. The unintentional programming of unselected memory cells is possible in rail-stack structures, particularly with respect to memory cells adjacent to those currently selected. Exemplary memory arrays utilizing rail stacks are described in U.S. Pat. No. 6,631,085 and U.S. Pat. No. 7,022,572.

Another type of three-dimensional memory includes pillars of layers formed at the intersection of upper and lower conductors. Pillar based memory arrays are characterized by the separation of the various structures forming each memory cell from similar structures forming adjacent memory cells. FIGS. 1A-1B are perspective and cross-sectional views, respectively, of a portion of a traditional monolithic three-dimensional memory array. Both the word line and bit line layers are shared between memory cells forming what is often referred to as a fully mirrored structure. A plurality of substantially parallel and coplanar conductors form a first set of bit lines 162 at a first memory level L0. Memory cells 152 at level L0 are formed between these bit lines and adjacent word lines 164. In the arrangement of FIGS. 1A-1B, word lines 164 are shared between memory layers L0 and L1 and thus, further connect to memory cells 170 at memory level L1. A third set of conductors form the bit lines 174 for these cells at level L1. These bit lines 174 are in turn shared between memory levels L1 and memory level L2, depicted in the cross-sectional view of FIG. 1B. Memory cells 178 are connected to bit lines 174 and word lines 176 to form the third memory level L2, memory cells 182 are connected to word lines 176 and bit lines 180 to form the fourth memory level L3, and memory cells 186 are connected to bit lines 180 and word lines 184 to form the fifth memory level L5. Exemplary memory arrays including pillar-based memory cells are described in U.S. Pat. Nos. 5,835,396, 6,034,882 and 6,984,561, each of which is incorporated by reference herein in its entirety.

FIGS. 2A-2F depict a fabrication technique for forming a pillar-type three-dimensional memory array as described in U.S. Pat. No. 6,034,882. A first conductor material 46 and first semiconductor layer stack 45 are deposited as shown in FIG. 2A. The layers are patterned and etched in a first direction to form substantially parallel first conductors 46a and 46b and first etched lines of the semiconductor layer stack in a single masking step as shown in FIG. 2B. The semiconductor layer stack is etched into lines 45a and 45b, but is not yet etched into pillars. The gaps between the lines of semiconductor layer stack and the conductors are filled with dielectric material (not shown) to insulate the wiring and devices from one another.

A second conductor material 50 and second semiconductor layer stack 51 are deposited as shown in FIG. 2C. A second pattern is applied followed by etching in a second direction to form substantially parallel second conductors 50a and 50b and second semiconductor layer stack lines 51a and 51b. The second direction is substantially orthogonal to the first direction. The second etch continues through the second conductors and the first semiconductor layer stack lines, to forming pillars 45a1, 45a2, 45b1 and 45b2. Because they were formed in a shared masking step, two opposing sidewalls of each of the first pillars (e.g. 45a1) are self-aligned with the edges of the first conductor below (e.g. 46a), while the other two opposing sidewalls of each of the first pillars are self-aligned with the edges of the second conductor above (e.g. 50a.) The gaps in between the second conductors and second lines of semiconductor material are filled with dielectric material.

After filling the gaps between adjacent lines, a third conductor material 52 and third semiconductor layer stack 53 are deposited as shown in FIG. 2E. A third pattern is applied, followed by etching again in the first direction as shown in FIG. 2F. The third etch forms substantially parallel third conductors 52a, 52b and third semiconductor layer stack lines 53a, 53b that are substantially perpendicular to the second conductors. The third etch continues through the third conductors and layer stack lines 51a, 51b, forming pillars 51a1, 51a2, 51b1, 51b2. Because they were formed in a shared masking step, the second pillars each have two opposing sidewalls that are self-aligned with the edges of the third conductor (e.g., 52a) above. The other two opposing sidewalls of the second pillars are self-aligned with the edges of the second conductors (e.g., 50a) below as a result of being formed in the shared second masking step.

As FIGS. 2A-2F illustrate, the formation of pillar structures requires precise alignment in forming the small feature sizes of the structures. Numerous processing difficulties may exist in the formation of these structures. For example, the technique in FIGS. 2A-2F etches one conductor layer and two semiconductor layer stacks in each of the masking operations. This technique is effective to self-align the pillars with both the overlying and underlying conductors. However, etching through a significant number of layers in a single etch process can pose its own set of difficulties. The structures may lack stability during various stages of the process. Moreover, the precision necessary in forming the features may be affected by such deep etches. Accordingly, there remains a need for improved three-dimensional pillar designs and corresponding fabrication processes for forming the same in non-volatile memory array technologies.

SUMMARY OF THE INVENTION

A self-aligned fabrication process for three-dimensional non-volatile memory is disclosed. A double etch process forms conductors at a given memory level in self-alignment with memory pillars both underlying and overlying the conductors. Forming the conductors in this manner can include etching a first conductor layer using a first repeating pattern in a given direction to form a first portion of the conductors. Etching with the first pattern also defines two opposing sidewalls of an underlying pillar structure, thereby self-aligning the conductors with the pillars. After etching, a second conductor layer is deposited followed by a semiconductor layer stack. Etching with a second pattern that repeats in the same direction as the first pattern is performed, thereby forming a second portion of the conductors that is self-aligned with overlying layer stack lines. These layer stack lines are then etched orthogonally to define a second set of pillars overlying the conductors.

A silicide process for forming conductors is also provided. Silicon can be etched to form conductor array lines for a memory array, followed by a silicidization process to form low resistance structures. Additional techniques for adjusting the size of the state change element relative to the memory pillar size are provided. Thermal oxidization and nitridation processes are disclosed for rounding square or rectangular pillar structures.

A method of fabricating a monolithic three-dimensional non-volatile memory array is provided in one embodiment that includes forming a first layer stack elongated in a first direction over a substrate. The first layer stack includes a first strip of conductive material and a plurality of strips of semiconductor material. A second layer of conductive material is then formed over the first layer stack, followed by etching using a first pattern that includes etching the second layer of conductive material into a second strip of conductive material elongated in a second direction that is substantially orthogonal to the first direction and etching the plurality of strips of semiconductor material into a pillar. The pillar includes first sidewalls elongated in the first direction and second sidewalls elongated in the second direction. The second sidewalls are self-aligned with sidewalls of the second strip of conductive material that are elongated in the second direction. A third layer of conductive material is formed over and in electrical contact with the second strip of conductive material after etching the second layer of conductive material and the plurality of strips of semiconductor material. Next, a set of semiconductor layers are formed over the third layer of conductive material, followed by etching the set of semiconductor layers and the third layer of conductive material using a second pattern. Etching with the second pattern includes etching the set of semiconductor layers into a second plurality of strips of semiconductor material elongated in the second direction and etching the third layer of conductive material into a third strip of conductive material elongated in the second direction. The third strip of conductive material includes sidewalls elongated in the second direction that are self-aligned with sidewalls of the second plurality of strips of semiconductor material that are elongated in the second direction.

A method of fabricating a monolithic three-dimensional non-volatile memory array in another embodiment includes forming a first set of conductors elongated in a first direction over a substrate and forming a first set semiconductor layer stack lines over the first set of conductors. A first layer of silicon is then formed over the first set of semiconductor layer stack lines, followed by etching the first layer of silicon and the first set of semiconductor layer stack lines according to a first pattern. The etching forms from the first layer of silicon a second set of conductors elongated in a second direction substantially orthogonal to the first direction. The etching also forms from the first set of semiconductor layer stack lines a first plurality of pillars at intersections of the first set of conductors and the second set of conductors. After etching, the second set of conductors is subjected to a silicidization process to form silicide conductors for the second set of conductors.

Other features, aspects, and objects of the disclosed technology can be obtained from a review of the specification, the figures, and the claims.

DETAILED DESCRIPTION

FIGS. 3A-3H are schematic illustrations of a fabrication sequence for a monolithic non-three-dimensional non-volatile memory array in accordance with one embodiment of the presently disclosed technology. Conceptually, the disclosed technique includes a double etch process in the same direction for each of the conductor layers except the first conductor layer. A semiconductor layer stack and underlying conductor layer are patterned in a first direction (e.g., north-to-south) and etched into strips elongated in a second orthogonal direction (e.g., east-to-west). A second conductor layer is then deposited and patterned in the second direction before forming a second semiconductor layer stack. The second conductor layer is etched into strips elongated in the first direction and the layer stack strips are etched into pillars. A third conductor layer is then deposited, followed by a second semiconductor layer stack. A third pattern is then formed, also in the second direction. The stack and third conductor layer are etched into strips elongated in the first direction. One strip from the third conductor layer and a corresponding strip from the second conductor layer combine to form a single conductor for the second set of array lines. A fourth conductor layer is then formed, followed by patterning and etching in the first direction. The fourth conductor layer forms portions of the third set of array lines that will be elongated in the second direction. Etching the fourth conductor layer includes etching the second semiconductor layer stack lines into pillars. By using this double etch technique, a particular conductor will have a first portion self-aligned with two opposing sidewalls of the underlying pillars and a second portion self-aligned with two opposing sidewalls of the overlying pillars. The technique differs from previous techniques by etching twice in the same direction before switching to the orthogonal direction.

Figure 1A:
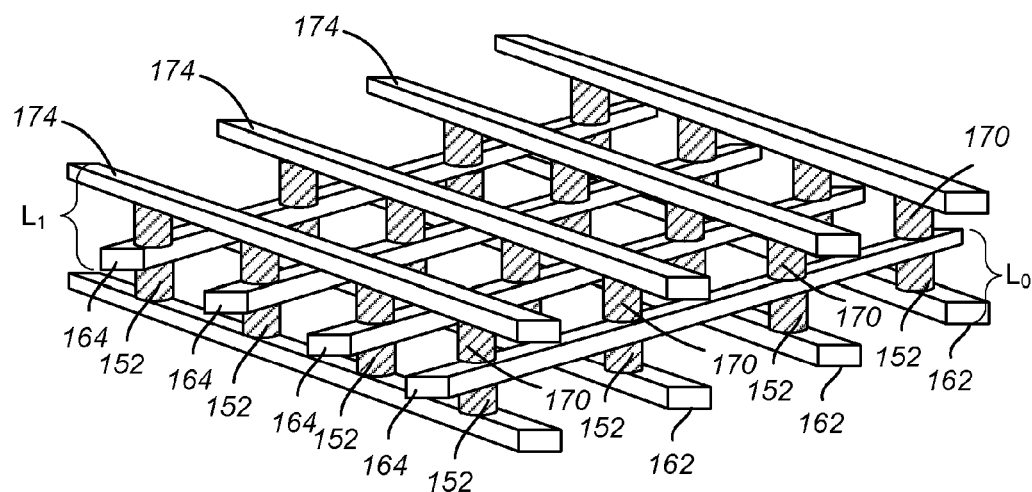
FIGS. 1A and 1B are respective perspective and cross-sectional views of a three-dimensional memory array.
Figure 1B:
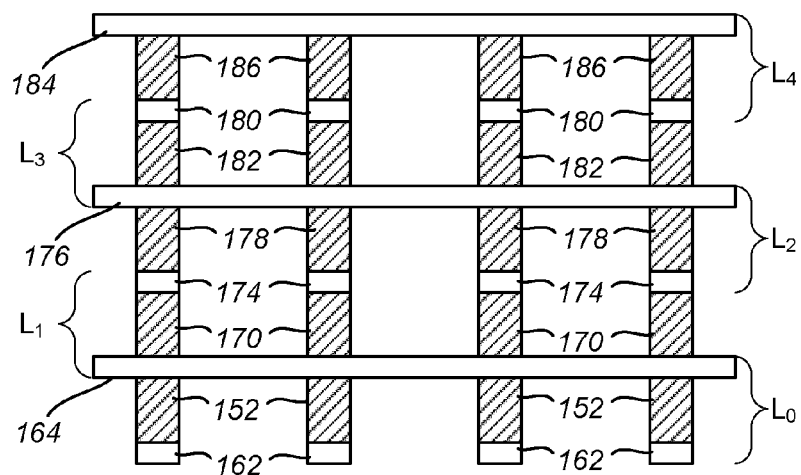
Figure 2A:
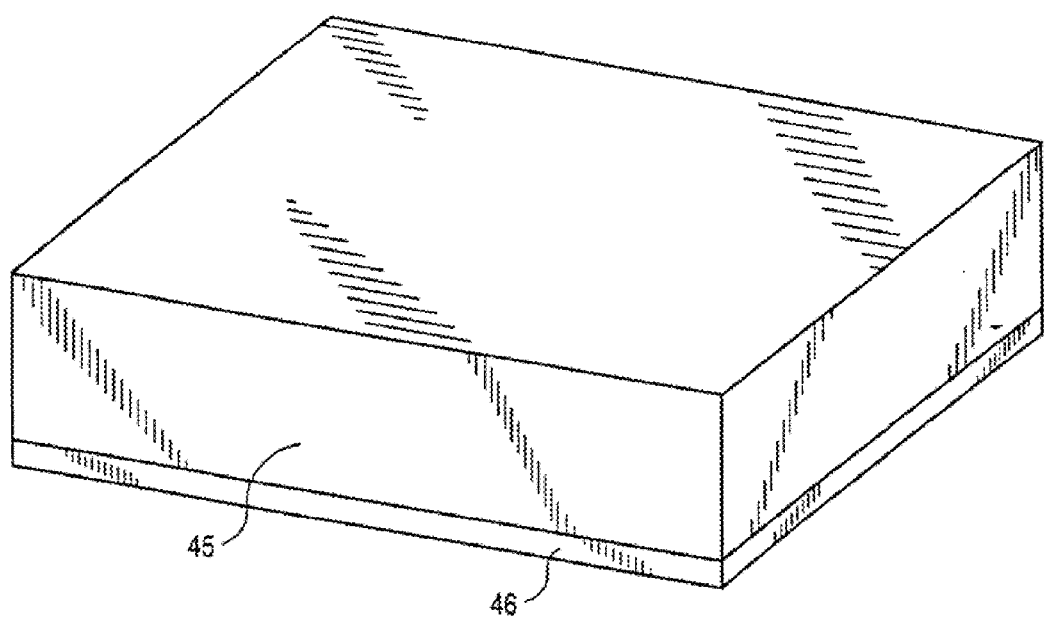
FIGS. 2A-2F schematically illustrate a fabrication process according to the prior art.
Figure 2B:
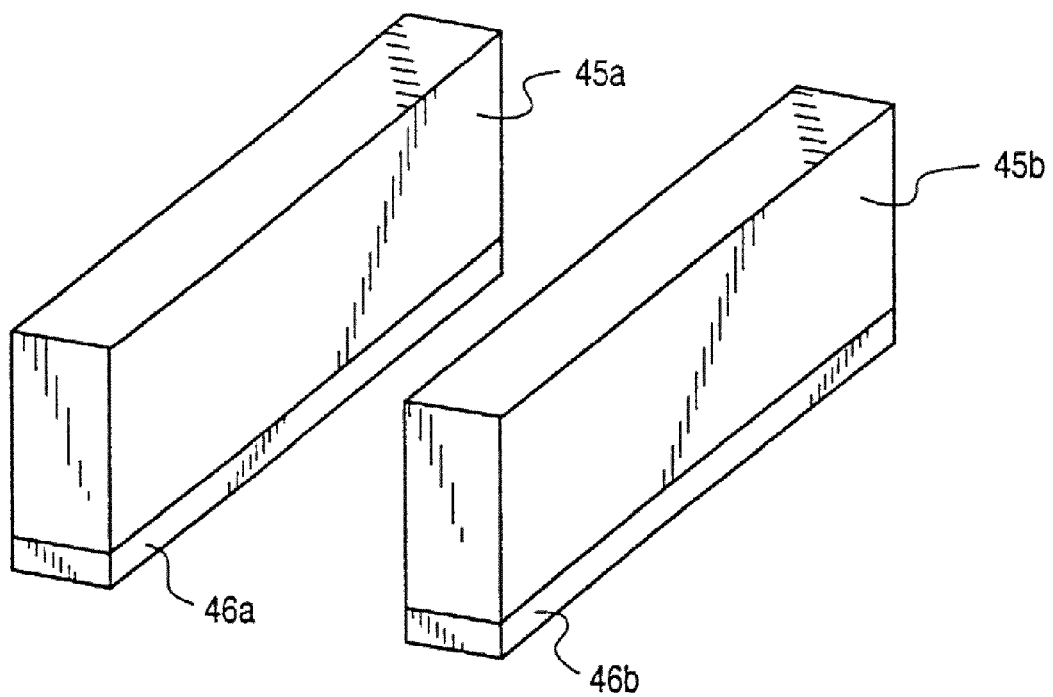
Figure 2C:
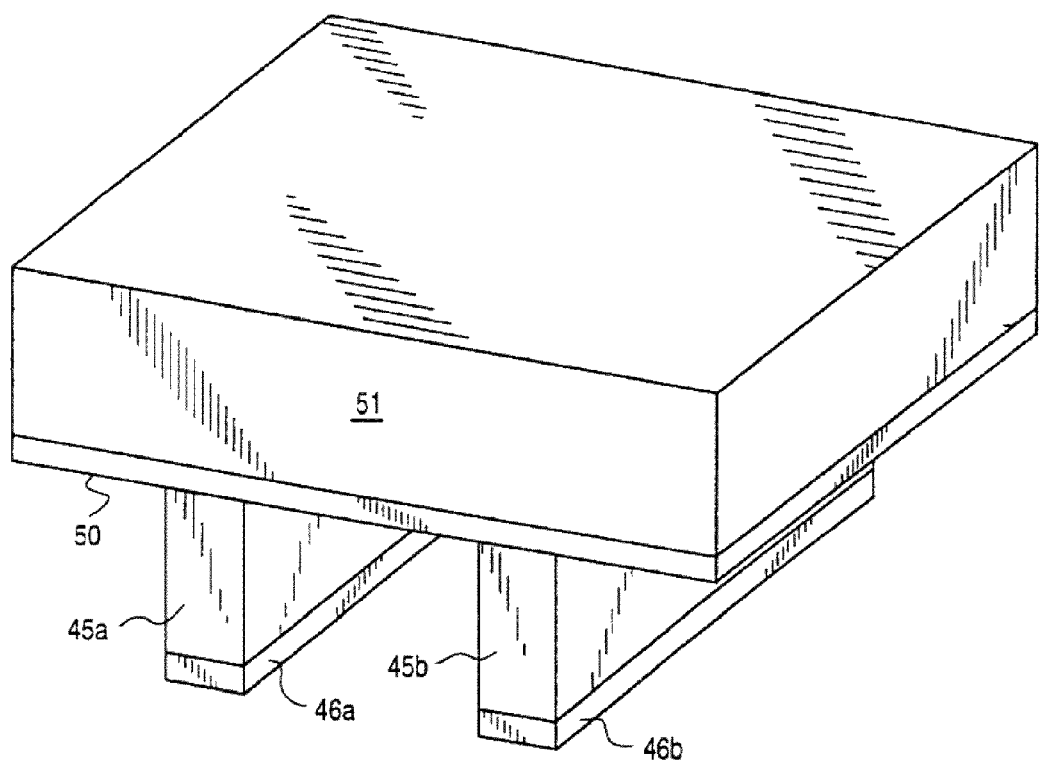
Figure 2D:
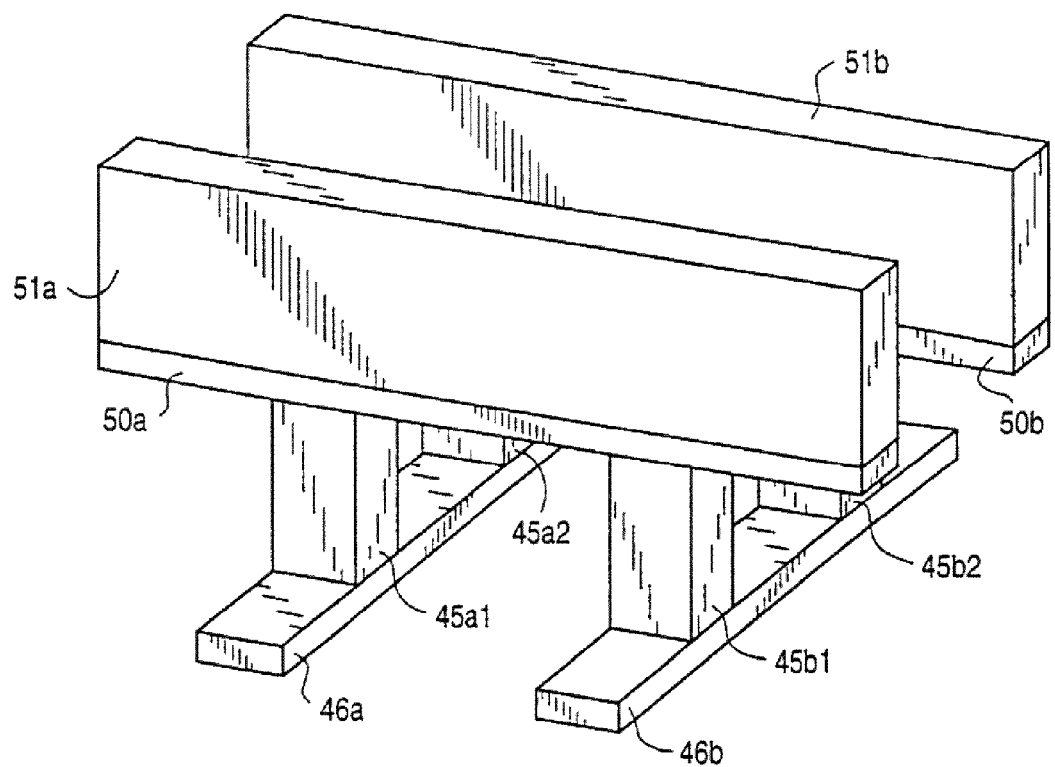
Figure 2E:
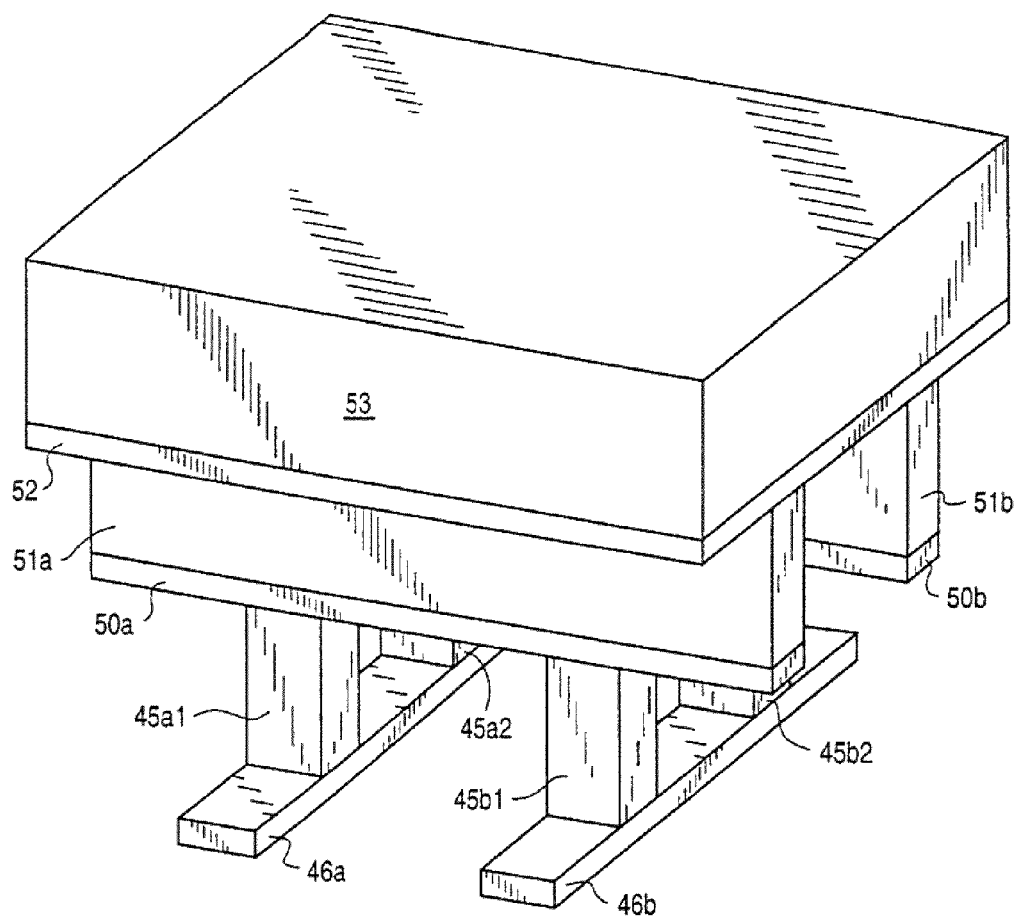
Figure 2F:
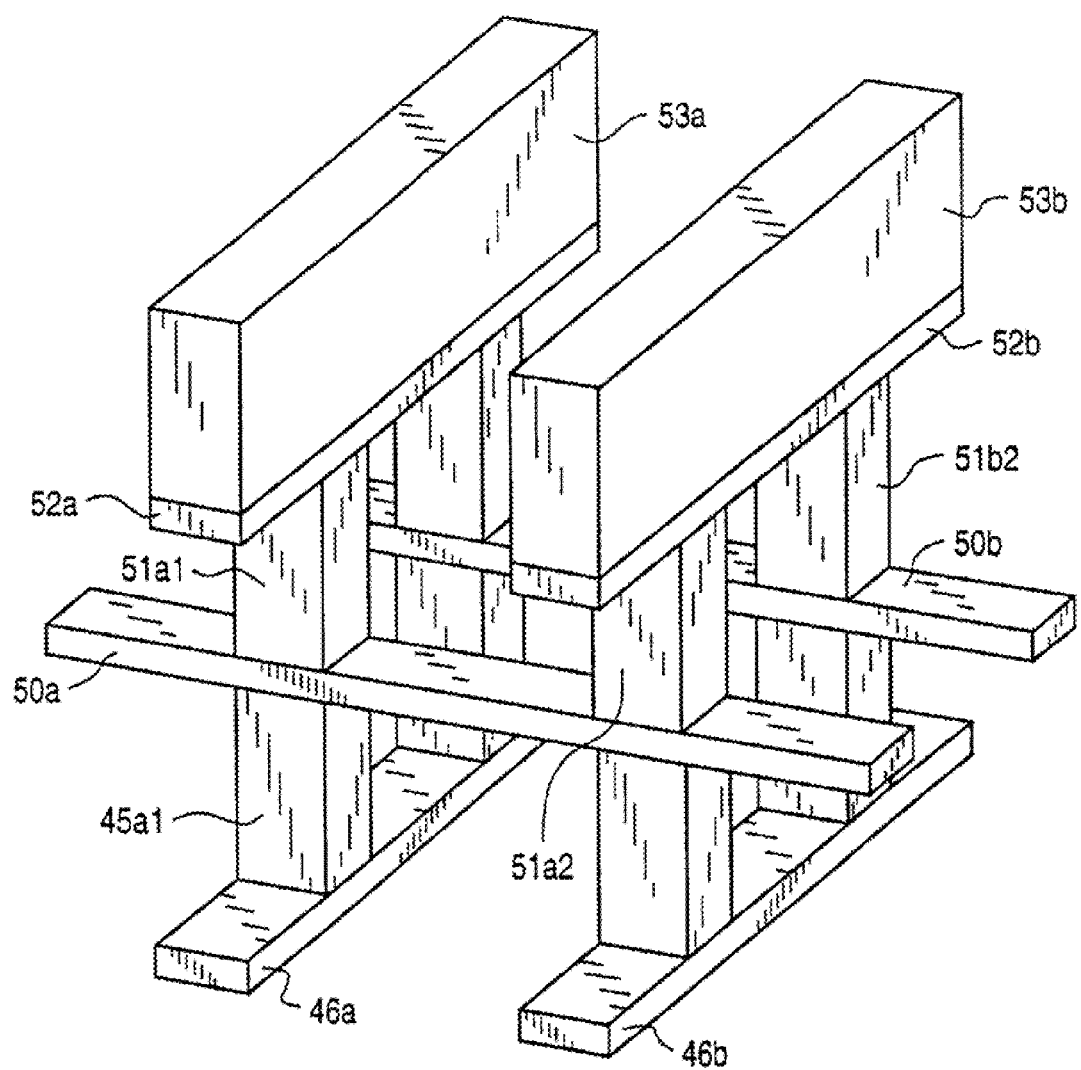
Figure 3A:
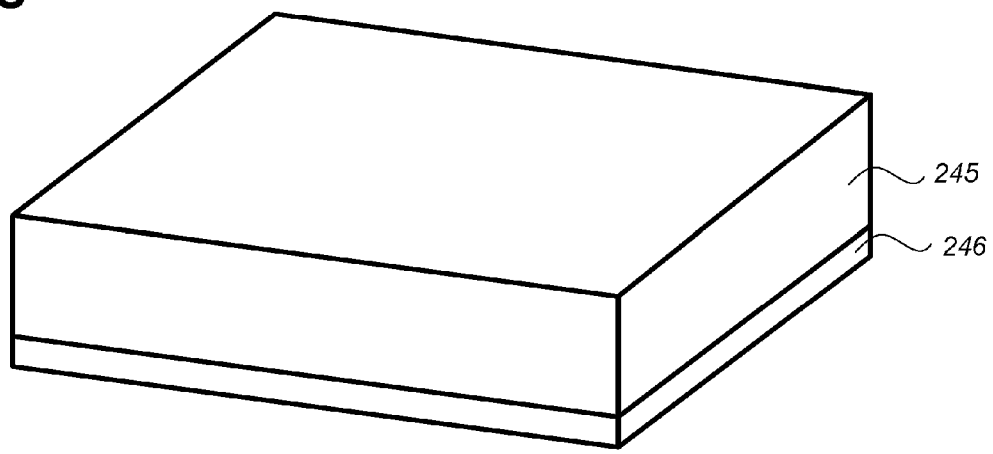
FIGS. 3A-3H are perspective views of a monolithic three-dimensional non-volatile memory illustrating a fabrication sequence according to one embodiment.

FIG. 3A is a perspective view of a small portion of the memory array after deposition and before patterning, depicting a conductor layer 246 and layer stack 245 as a continuous sheet extending across the entire integrated circuit or across the entire wafer (not shown). The semiconductor layer stack includes a plurality of semiconductor layers that will eventually form the memory cells of the array. The layers include materials for the steering element and optionally, materials for the state change element, though the state change material layer can be formed independently of the layer stack as described in the following more detailed examples. The conductor layer will form a first set of array lines and may be fabricated from any conductive material such as a metal or a polysilicon.

Figure 3B:
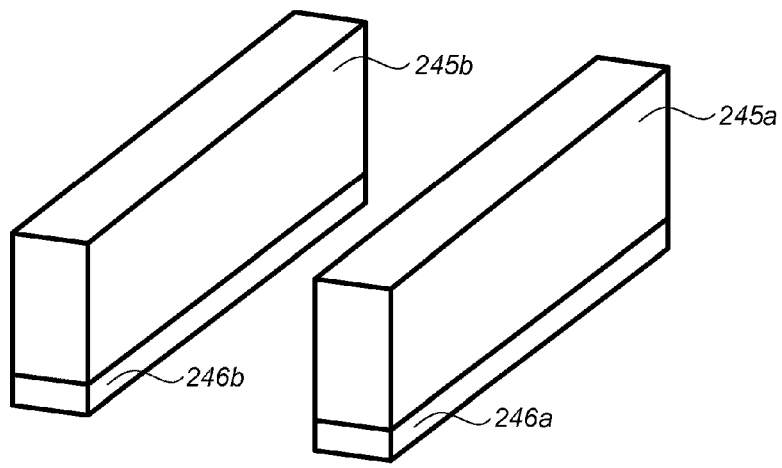

A first pattern which defines the features on the first conductor layer is then applied, and the features etched into the layer stack 245 and conductor layer 246. The first pattern includes patterning strips repeating in a first direction over the first conductor layer. The patterning strips are elongated in a second direction with spaces between strips adjacent in the first direction, the first and second directions being substantially orthogonal. A pattern that repeats in a given direction is referred to herein as patterning in that given direction. Etching according to such a pattern will also be referred to as etching in that given direction. The first pattern can be formed of strips of photoresist or a hard-masking material. The pattern could also be formed using spacer-assisted patterning techniques with spacers forming the patterning strips. The resulting structure after etching is depicted in FIG. 3B. Both the layer stack and conductor layer are etched into long continuous strips 245a, 246a and 245b, 246b. Strips 246a and 246b form a first set of array lines (conductors) and strips 245a and 245b form a first set of semiconductor layer stack lines. The first set of array lines are elongated over the surface of the substrate in the second direction (e.g., y-direction) with spaces between array lines that are adjacent in the first direction (e.g., x-direction). Each semiconductor layer stack line is also elongated in the first direction and is formed over one of the first set of array lines. In this embodiment, the first set of array lines and the first set of semiconductor layer stack lines are formed using a shared pattern and etch process to self-align first sidewalls of each semiconductor layer stack line with the edges of its corresponding underlying first conductor. Other techniques, such as forming the first set of array lines by a damascene process followed by patterning of a layer stack into the individual layer stack lines can also be used.

Figure 3C:
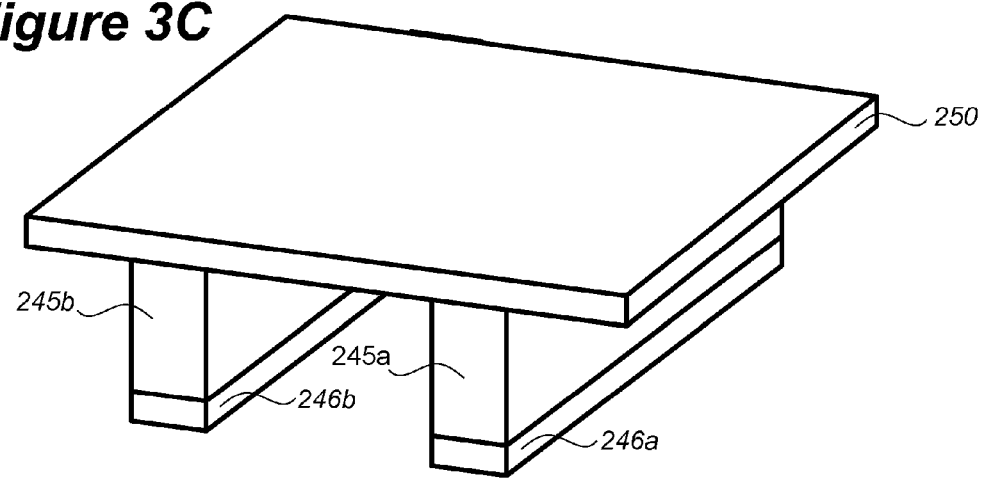

The spaces between adjacent array lines and adjacent layer stack lines are filled with a dielectric material (not shown) to insulate and provide support for the individual structures. A planarization step, using chemical mechanical polishing (CMP) for example, is used to expose the upper surface of the layer stack lines. A second conductor layer 250 for forming a first portion of each conductor in a second set of array lines is deposited over the first set of semiconductor layer stack lines as shown in FIG. 3C. The first conductor layer is deposited over the entire wafer, extending in both the x and y-directions as a continuous sheet.

Figure 3D:
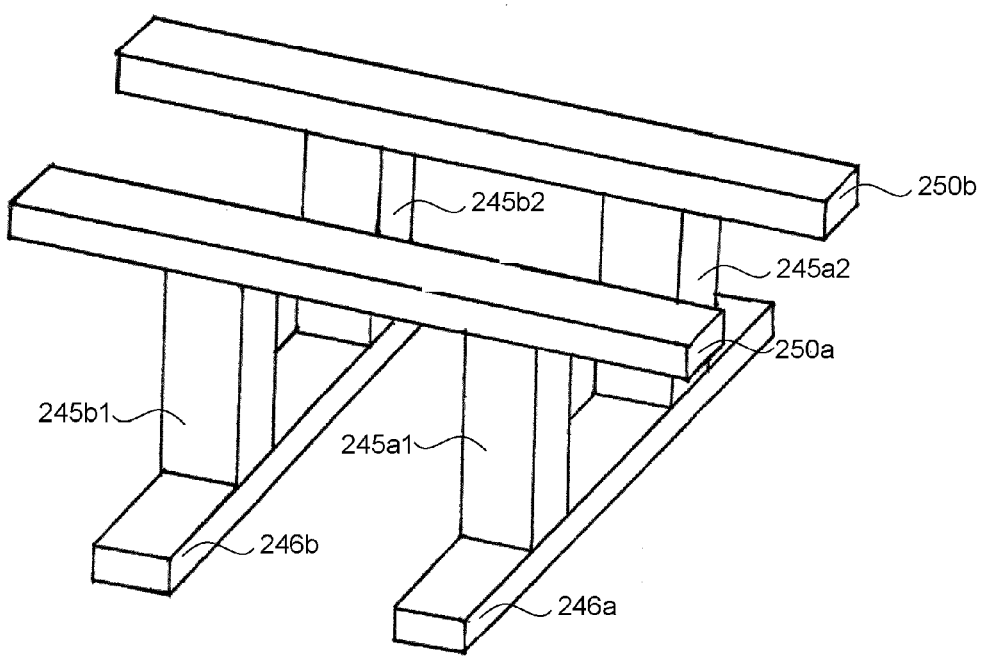

A second pattern is then formed over the first conductor layer, followed by etching the first conductor layer and the first set of semiconductor layer stack lines as shown in FIG. 3D. The second pattern includes strips elongated in the first direction repeating with spaces therebetween in the second direction. Using the pattern as a mask, the second conductor layer is etched into strips 250a and 250b that are elongated in the first direction. Etching continues through the first conductor layer and through at least a portion of the layers in the first set of semiconductor layer lines 245a and 245b. Etching can proceed through all the layers in the first set of semiconductor layer stack lines as depicted in FIG. 3D or only a portion of the layers as will be described in more detail hereinafter. Etching through the first set of semiconductor layer stack lines forms a first set of pillars 245a1, 245a2, 245b1 and 245b2 between the first set of array lines and the strips of the second conductor layer. Because the first set of layer stack lines and the first conductor layer are etched with a shared pattern, the pillars include second sidewalls that are self-aligned with edges of the strips of the second conductor layer that extend in the first direction. If a shared pattern is used in forming the first set of semiconductor layer stack lines and the first set of array lines, the pillars will include first sidewalls self-aligned with edges of the first set of array lines that extend in the second direction.

It is noted that the fabrication sequence etches to form the pillars at the first memory level and a portion of each conductor in the second set of array lines prior to forming a second semiconductor layer stack for forming pillars at the second memory level. Hence, the etch process for forming the first level pillars only includes etching one semiconductor layer stack. This can be contrasted with the technique described in FIGS. 2A-2F, where the second level semiconductor layer stack is etched into layer stack lines in the same etch process used to etch the first level semiconductor layer stack lines into pillars.

Figure 3E:
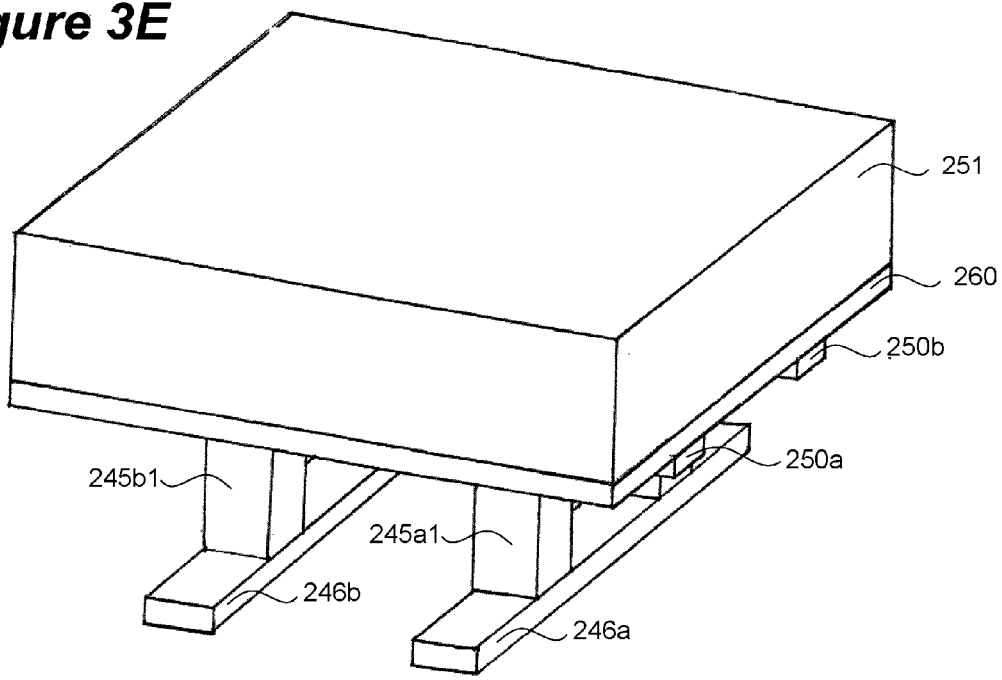

After etching to form pillars and the first portion of each array line in the second set of array lines, a dielectric material (not shown) is deposited to fill the resulting spaces in the first direction and thereby insulate the pillars and array lines. Following this, a second conductor layer 260 for forming second portions of each array line in the second set is deposited over the memory as shown in FIG. 3E. After depositing the second conductor layer, a series of layers for a second semiconductor layer stack 251 is deposited over the second conductor layer. As with the first semiconductor layer stack, the second layer stack can include different materials in different implementations. Moreover, the second stack can include a layer of state change material in one example, or the layer of state change material for the second memory level can be formed independently.

Figure 3F:
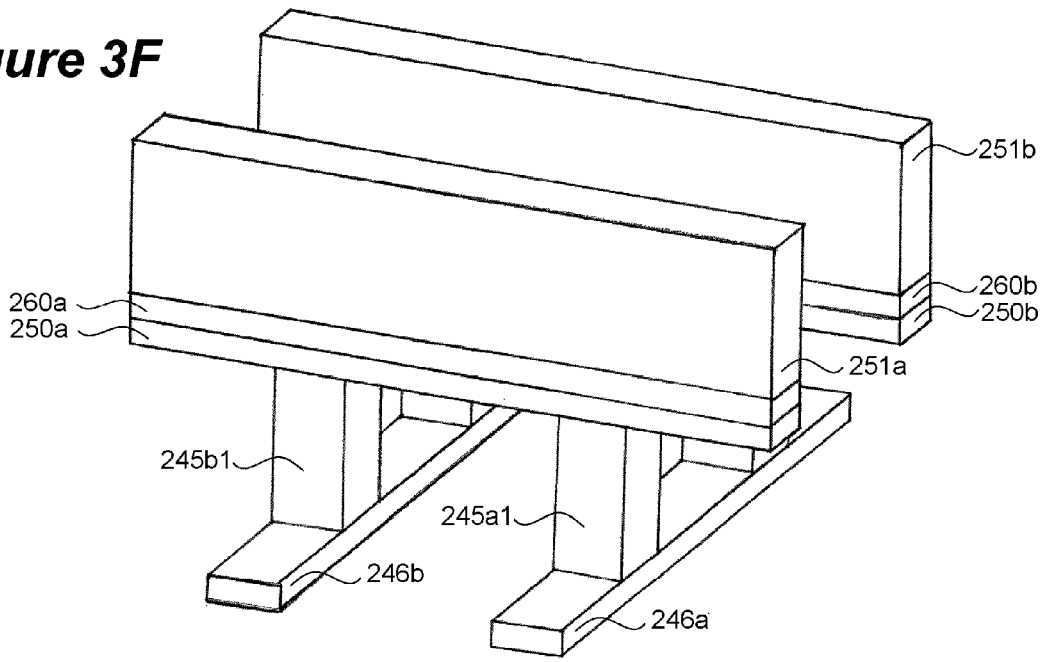

After depositing the second conductor layer and the second semiconductor layer stack, a third pattern is formed over the wafer. Like the second pattern, the third pattern includes patterning strips elongated in the first direction with spaces repeating therebetween in the second direction. Using the third pattern as a mask, the second semiconductor layer stack 251 and underling third conductor layer 260 are etched as shown in FIG. 3F. Etching the third conductor layer 260 forms second portions 260a and 260b for the second set of array lines. These second portions are elongated in the first direction over the first portions 250a and 250b. Together, one first portion and one second portion form one conductor or array line of the second set. For example, strips 250a and 260a form a single conductor of the second set and strips 250b and 260b form a single conductor of the second set. Etching layer stack 251 forms a second set of semiconductor layer stack lines 251a and 251b. These layer stack lines are elongated in the first direction over the second set of array lines.

Figure 3G:
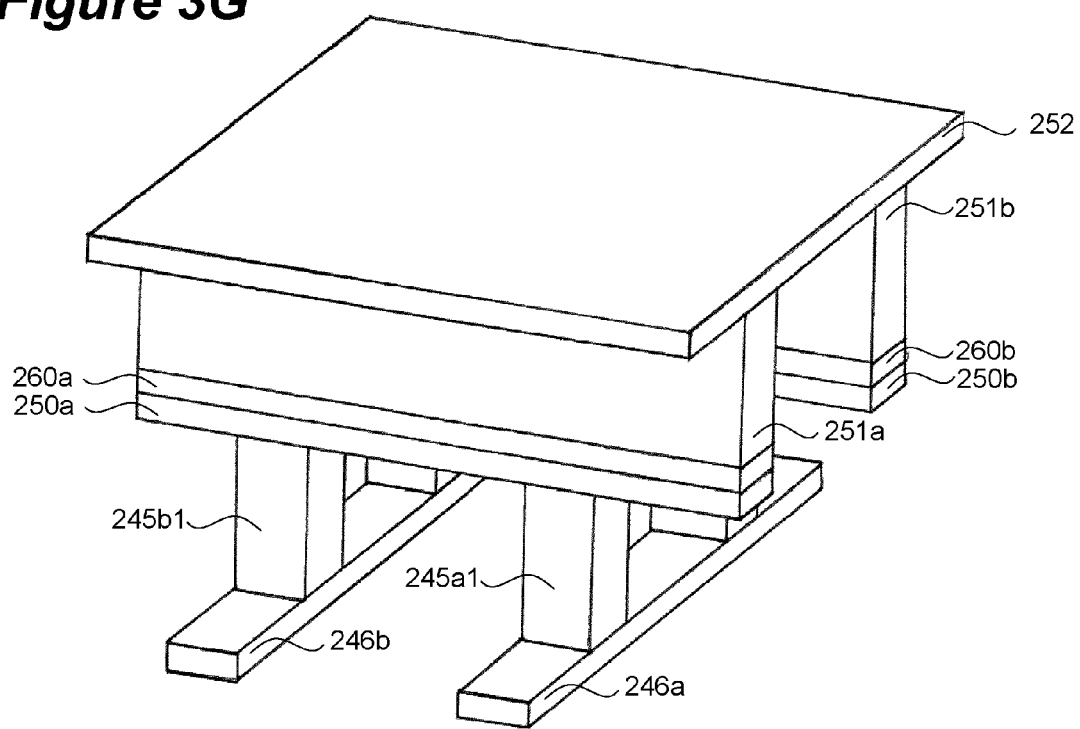
Figure 3H:
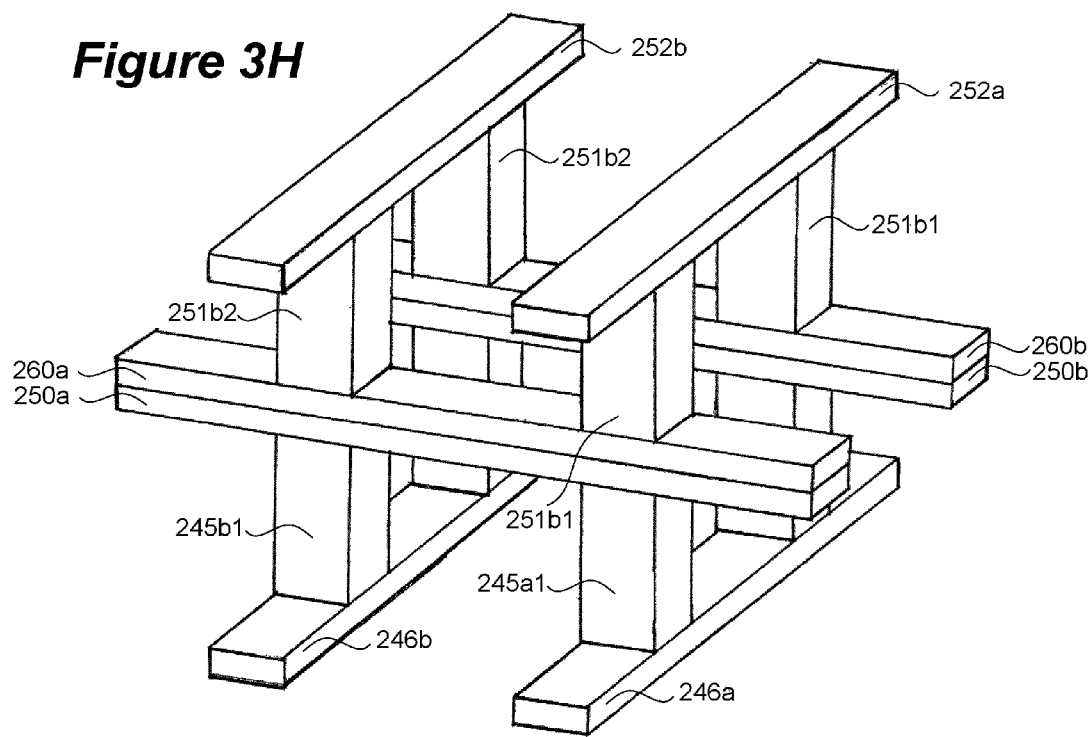

A fourth conductor layer 252 is deposited over the wafer as shown in FIG. 3G. The fourth conductor layer will form first portions of the array lines for a third set of array lines. Before forming a third semiconductor layer stack, a fourth pattern is applied for etching the fourth conductor layer. The fourth pattern includes strips elongated in the second direction repeating with spaces therebetween in the first direction. The fourth conductor layer is etched into first portions 252a and 252b of the third set of array lines as shown in FIG. 3H. The first portions of the third set of array lines are elongated in the second direction. Processing would continue after FIG. 3H by filling with a dielectric material, then depositing a fifth conductor layer and third semiconductor layer stack. Additional etching in the first direction follows to form second portions of the third set of array lines and to form third semiconductor layer line stacks.

As the process of FIGS. 3A-3H illustrate, the masking or patterning sequence includes patterning in a first direction to form the first set of array lines and first semiconductor layer lines, followed by patterning in a second orthogonal direction to form a first portion of the second set of array lines. The next patterning step is also in the second direction, forming second portions of the second set of array lines and second semiconductor layer lines. The fourth patterning step is in the first direction, forming first portions of a third set of array lines and the firth patterning step is also in the first direction, forming second portions of the third set of array lines. This can be contrasted with the technique described in FIGS. 2A-2F that patterns in orthogonal directions for each alternating patterning step. That technique patterns in the first direction for the first set of array lines, then the second direction for the second set of array lines. The third pattern in this technique is again in the first direction to form the third set of array lines and the fourth pattern is in the second direction to form the fourth set of array lines. By contrast, the presently disclosed technique patterns in the first direction, then the second direction, then the second direction again before switching back to the first direction.

Figure 4A:
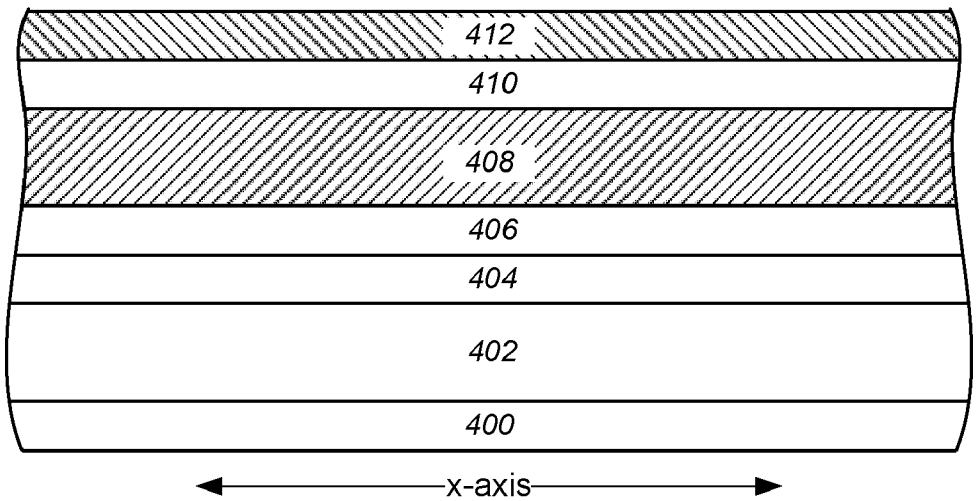
FIGS. 4A-4U are cross-sectional and overhead views of a monolithic three-dimensional non-volatile memory illustrating a detailed fabrication sequence according to one embodiment.
Figure 4B:
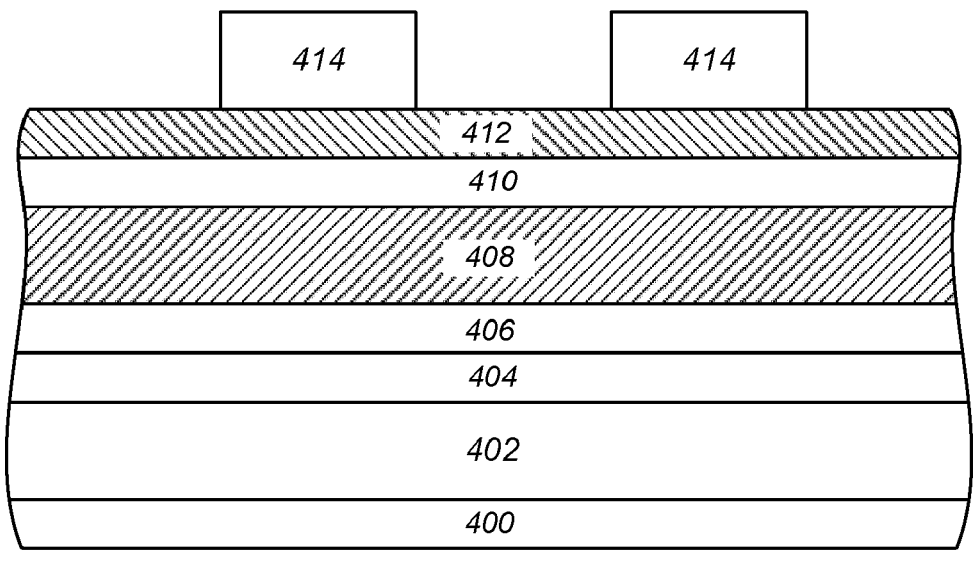
Figure 4C:
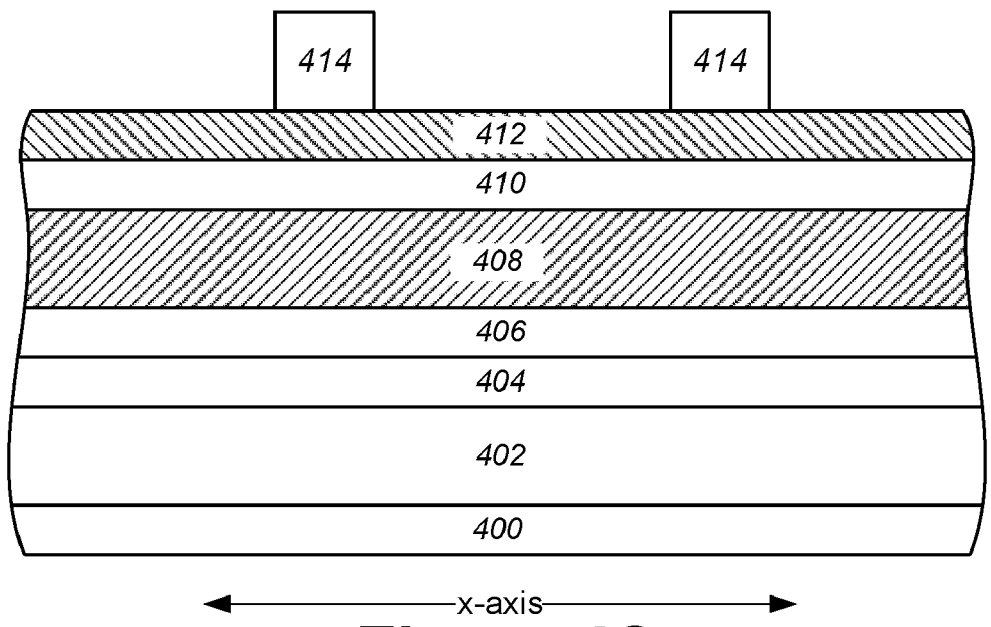
Figure 4D:
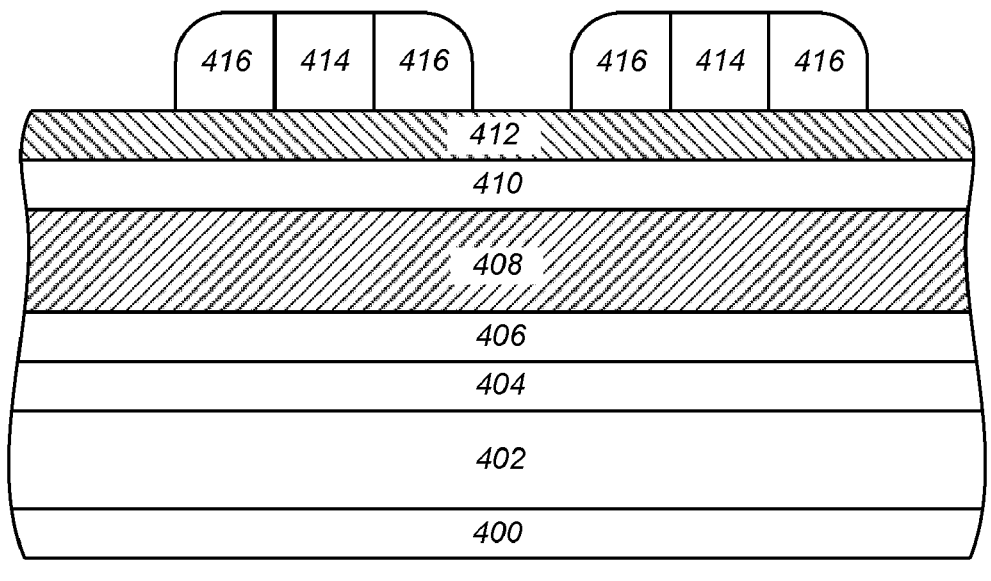
Figure 4E:
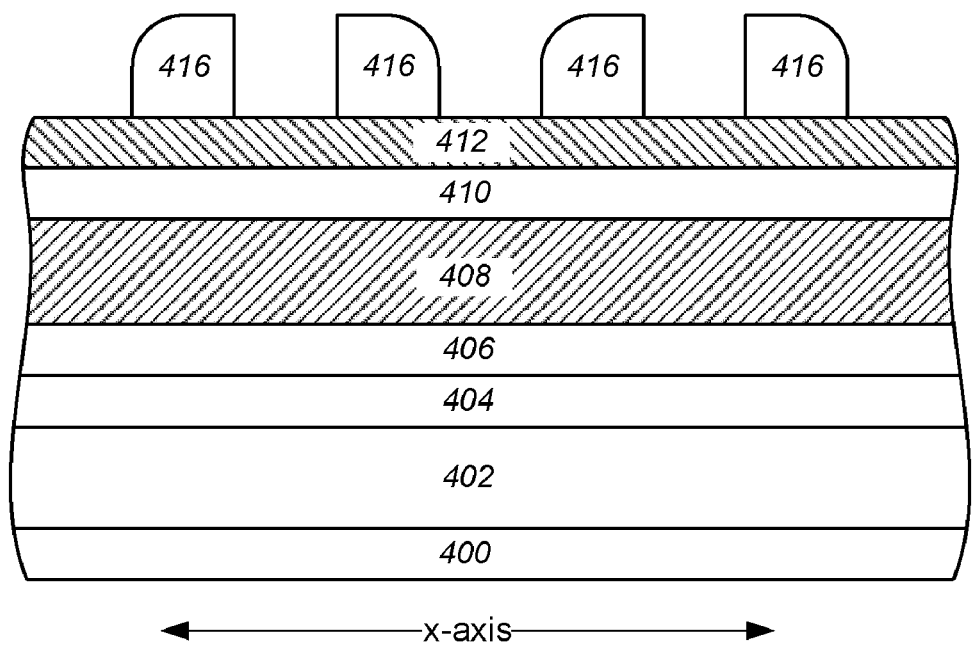
Figure 4F:
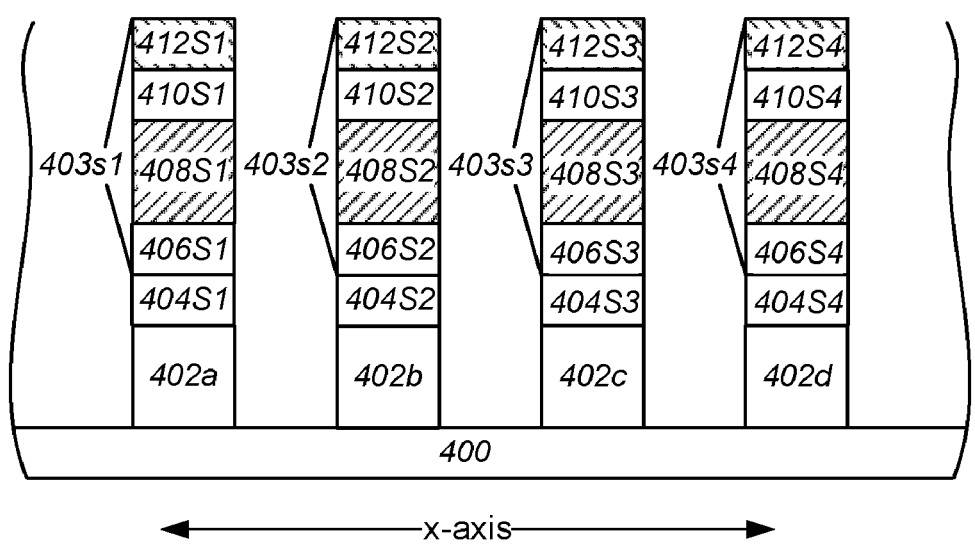
Figure 4G:
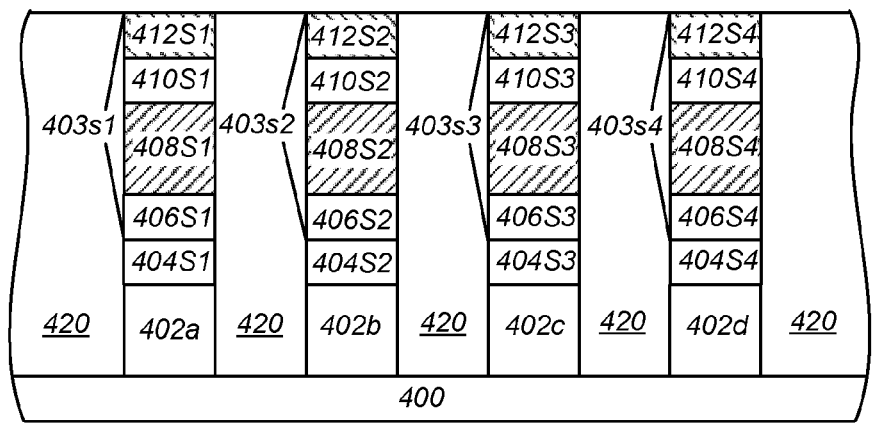
Figure 4H:
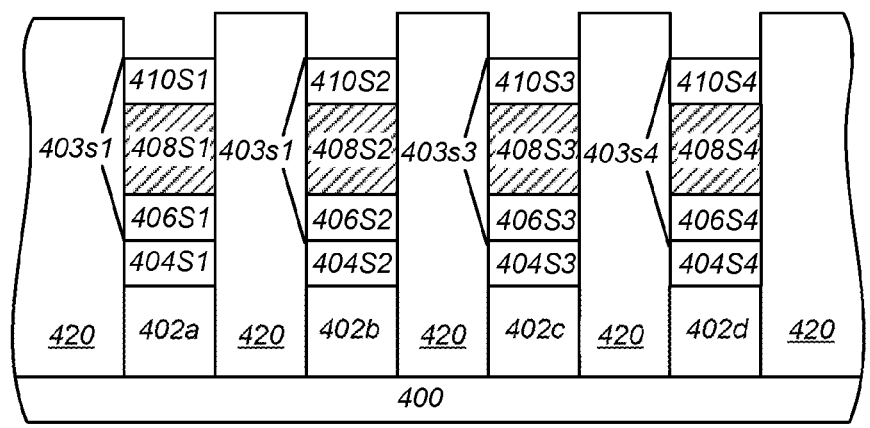
Figure 4I:
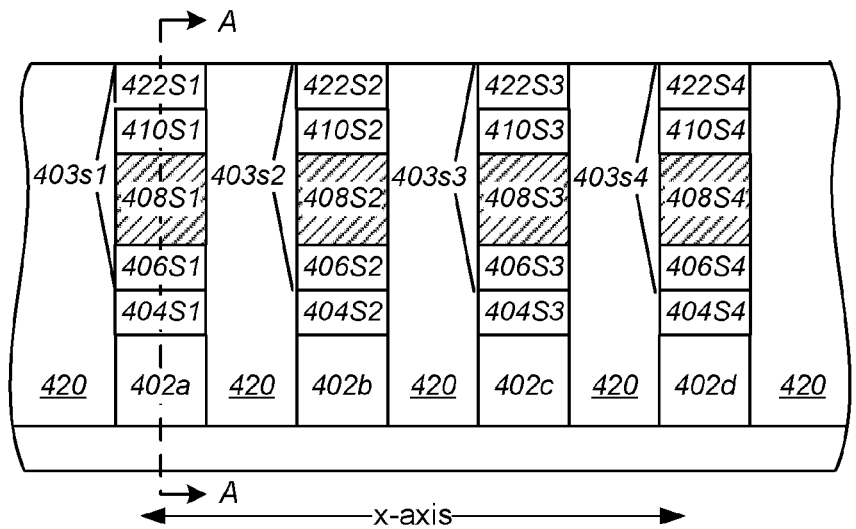
Figure 4J:
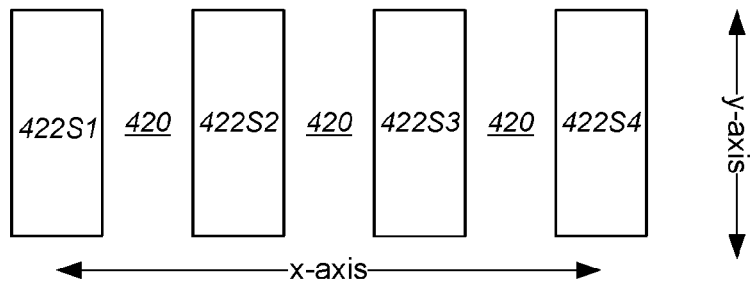
Figure 4K:
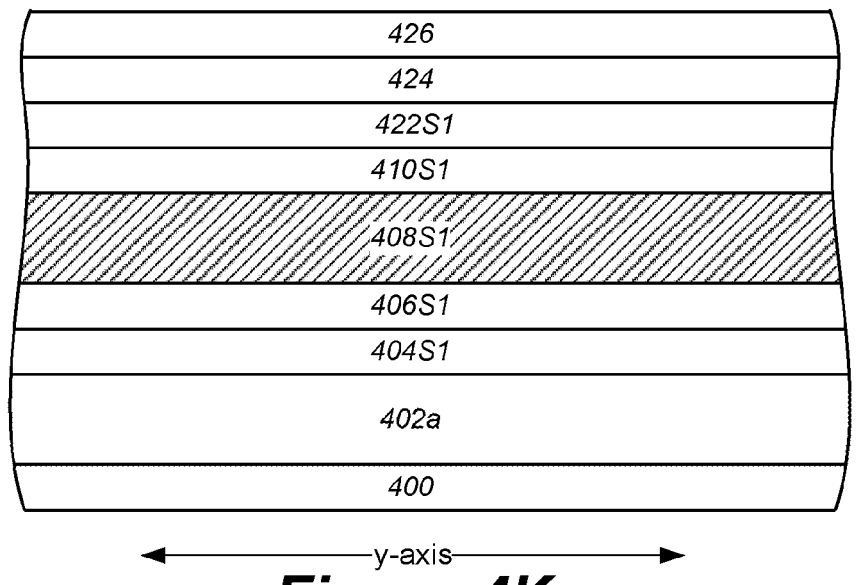
Figure 4L:
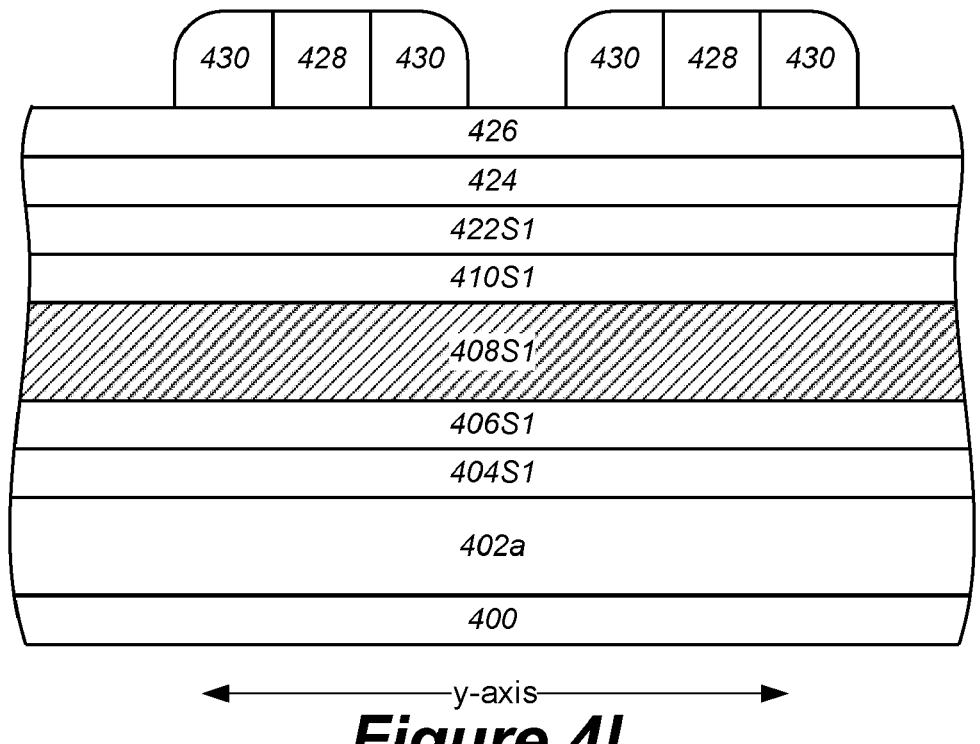
Figure 4M:
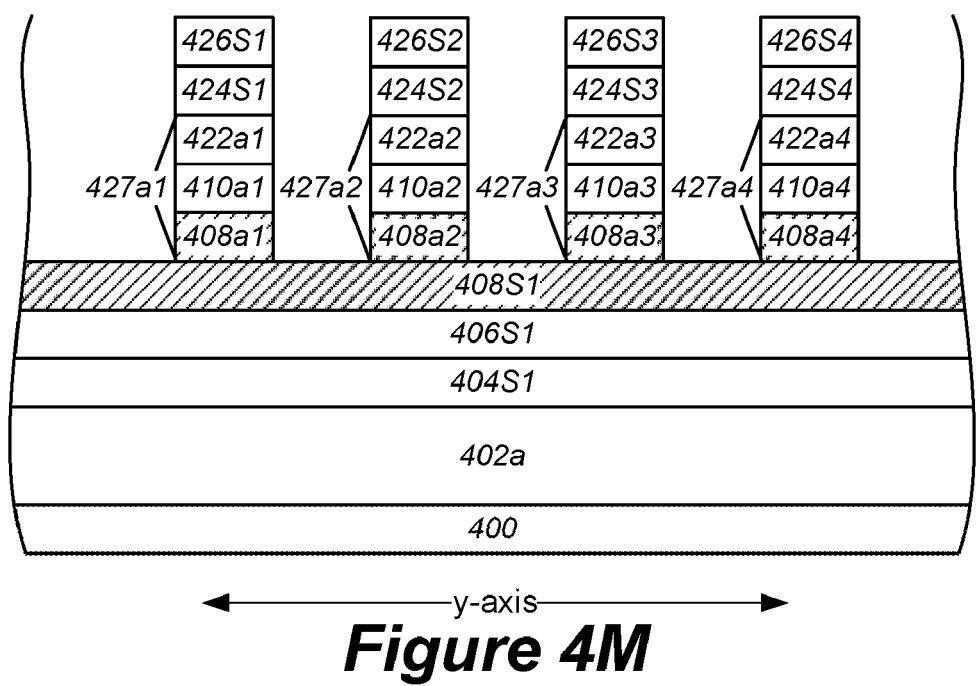
Figure 4N:
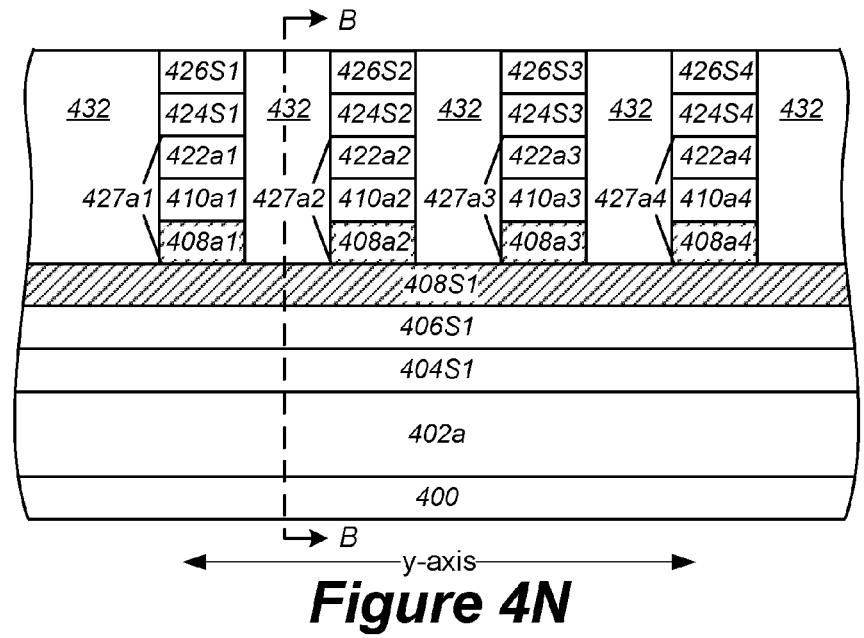
Figure 4O:
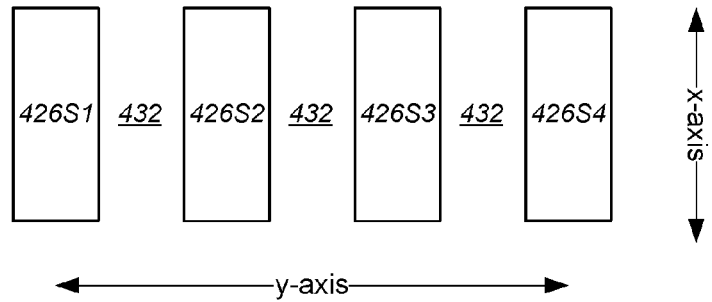
Figure 4P:
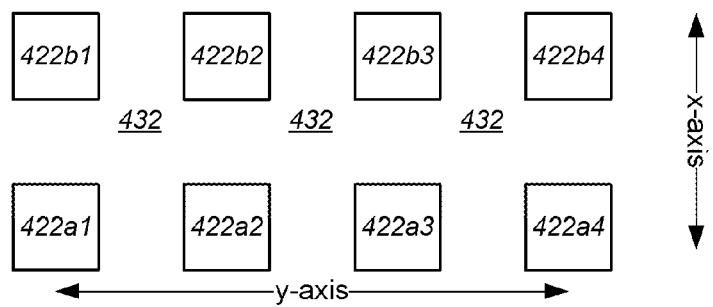
Figure 4Q:
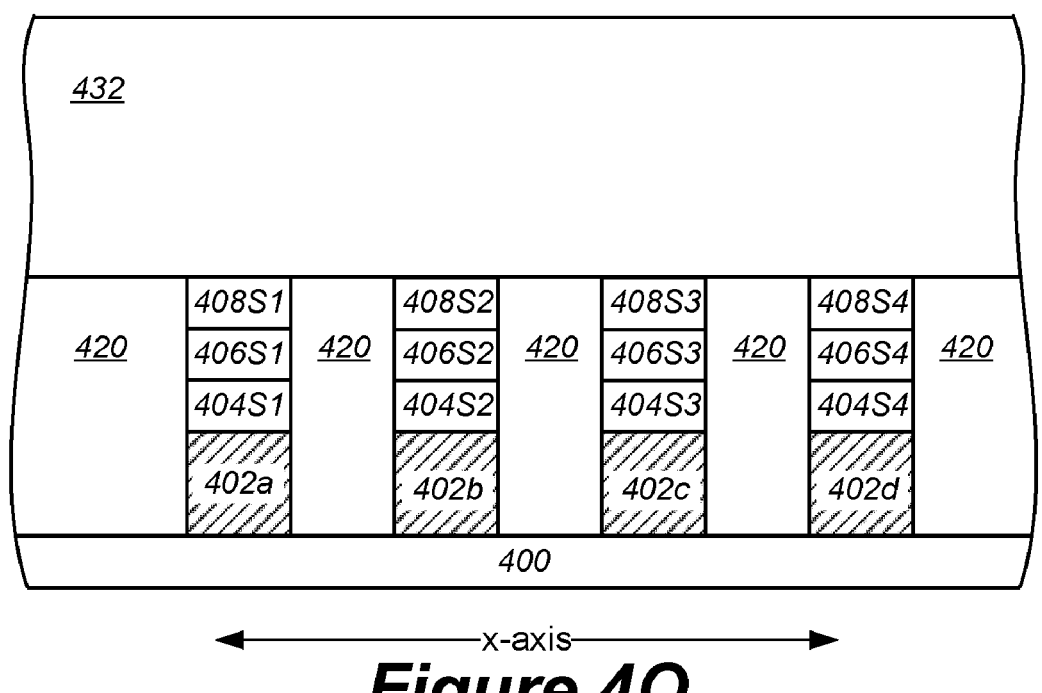
Figure 4R:
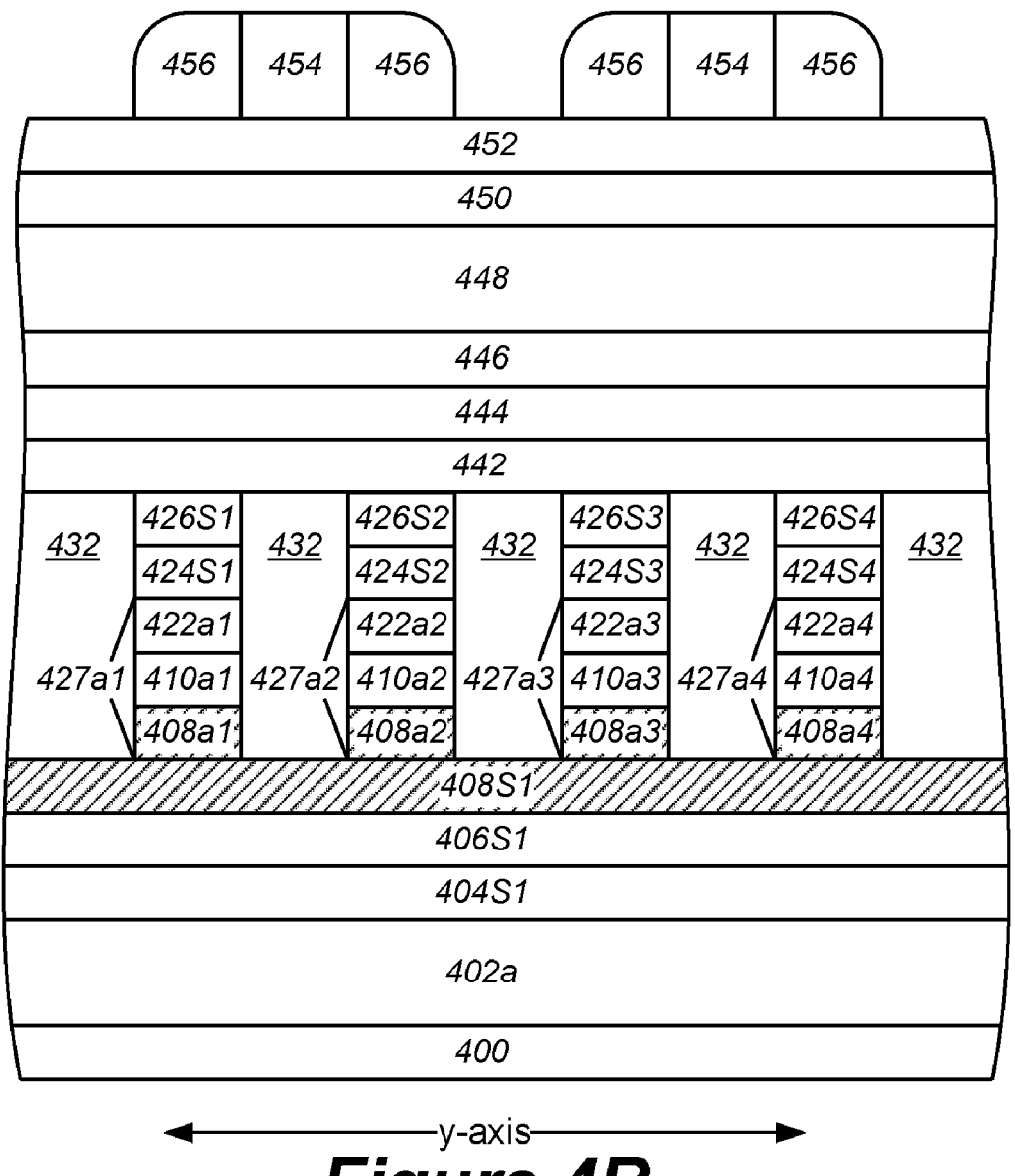
Figure 4S:
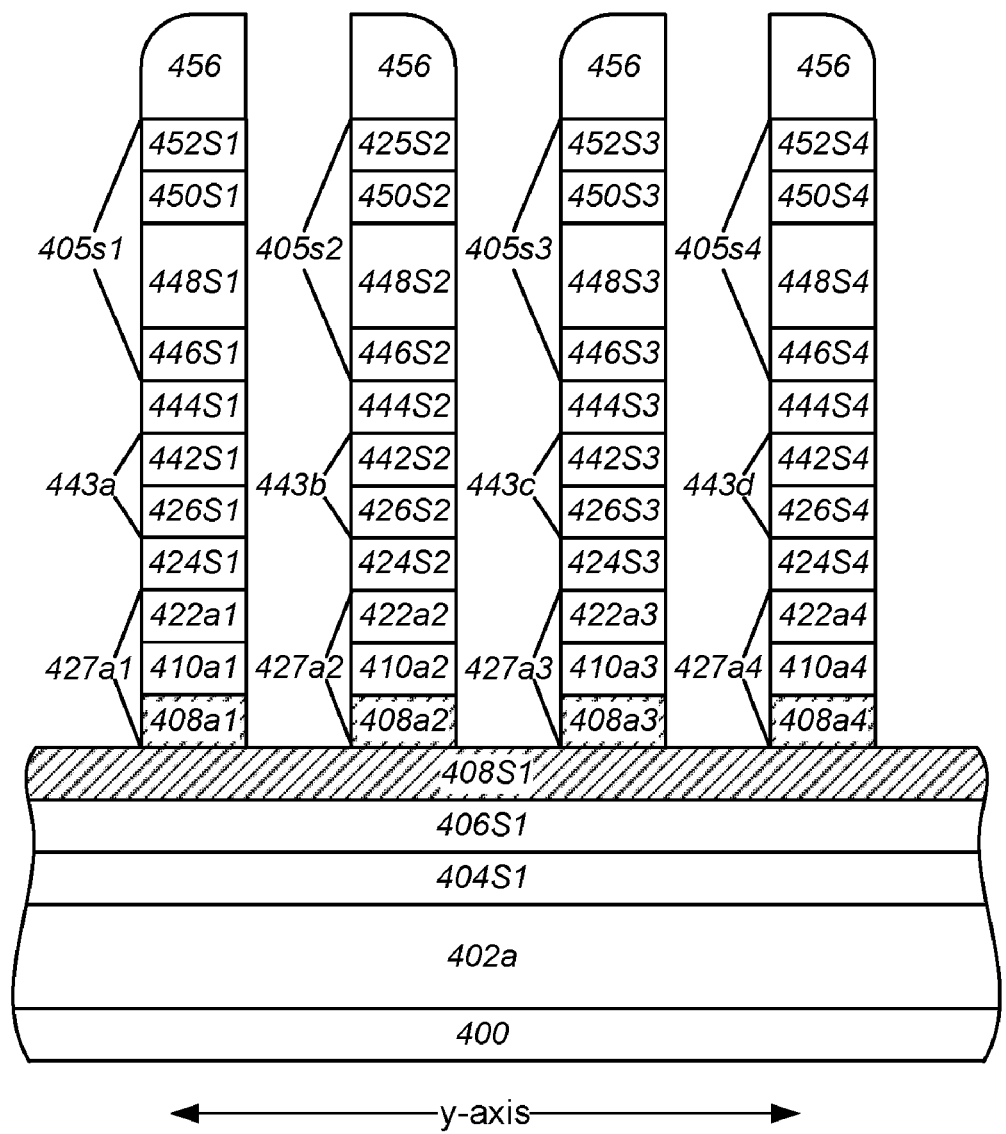
Figure 4T:
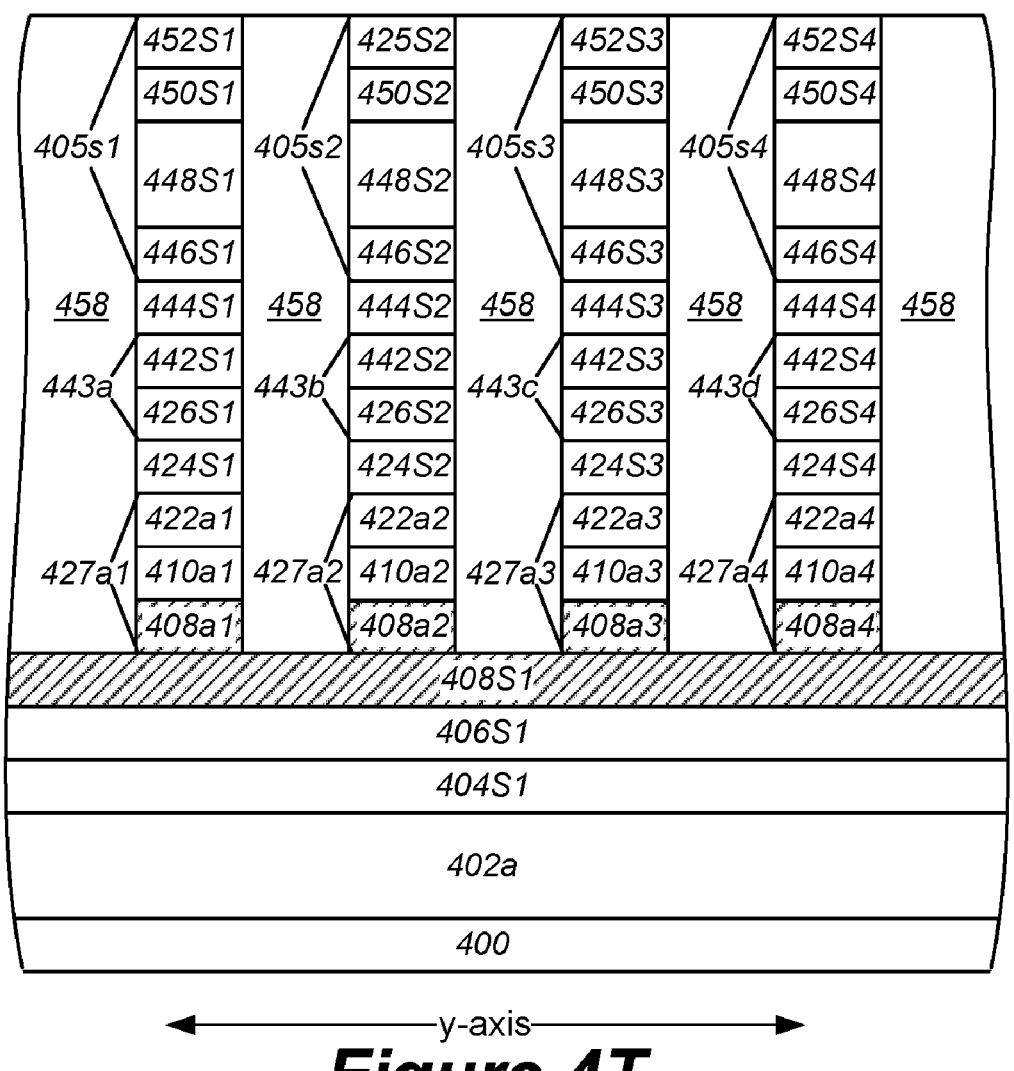
Figure 4U:
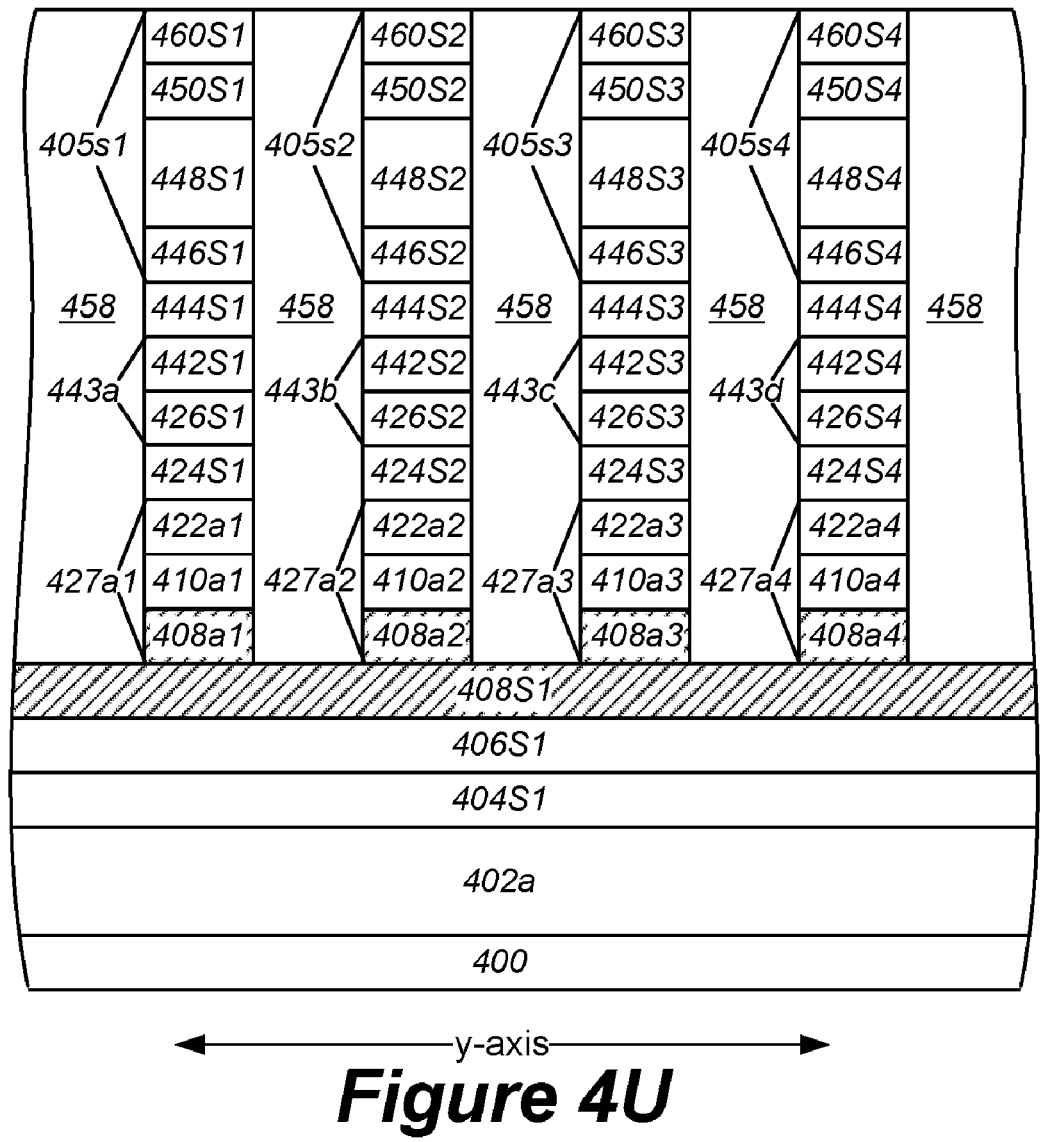

FIGS. 4A-4U schematically illustrate a detailed fabrication process in accordance with embodiment for forming a monolithic three-dimensional memory array. Substrate 400 in FIG. 4A may undergo initial processing to form transistors (for example CMOS) in the substrate for the peripheral circuitry. The substrate can be any semiconductor substrate such as monocrystalline silicon, IV-IV compounds, III-V compounds, II-VII compounds, etc. and include epitaxial or other semiconductor layers formed over the substrate. Although not depicted, an insulating layer can be formed over the substrate surface followed by planarization using chemical and mechanical polishing, resist etch-back planarization or any number of other suitable planarization technologies to provide a substantially uniform surface upon which to begin the fabrication sequence. Note that the various thicknesses and dimensions of the layers and features described below are exemplary only and will be modified in various implementations depending upon the characteristics of the desired device.

A first conductor layer 402 is formed over the substrate surface or any insulating layer formed thereon. A number of suitable conducting materials can be used for layer 402. For example, the conductor layer is a metal layer in one embodiment including but not limited to tantalum, titanium, tungsten, copper cobalt or alloys thereof. Any suitable process can be used to form the conductor layer such as chemical vapor deposition (CVD), physical vapor deposition (PVD) or atomic layer deposition (ALD). For example, in one exemplary embodiment conductor layer 402 is a layer of tungsten deposited by CVD to a thickness of about 3,000 A. Optional adhesion layers (not shown) may be formed over the insulating layer to aid in the adhesion of conductor layer 602. A barrier metal layer 404 is formed over conductor layer 402. The barrier metal layer is optional. Numerous metals can be used for the barrier metal layer including but not limited to titanium nitride. In one example, barrier metal layer 602 has a thickness of 150 A.

A first semiconductor layer stack including layers 406, 408, 410 is formed over the barrier metal layer 404. The semiconductor layer stack can vary by embodiment depending upon the exact memory cell configuration to be used. In a particularly disclosed example, the semiconductor layer stack includes a first semiconductor layer 406 of a first conductivity type separated from a second semiconductor layer 410 of a second conductivity type by an intrinsic layer 408. The materials for the various layers in the semiconductor layer stack can be formed using any suitable materials, including but not limited to silicon, silicon-germanium, silicon-germanium-carbon, germanium or other suitable IV-IV compounds, gallium arsenide, indium phosphide, or other suitable III-V compounds, zinc selenide, or other II-VII compounds, or a combination of these materials. Silicon is the most widely used semiconductor material so for simplicity, reference is frequently made herein to silicon, but it will be understood that other materials may be substituted. Layer 406 is a heavily doped N+ type silicon layer in one embodiment. The heavily doped N+ silicon layer can be doped at a concentration greater than $5 \times 10^{18}$ atoms/cm$^3$ in one embodiment, doped at a concentration greater than $1 \times 10^{19}$ atoms/cm$^3$ in another embodiment, and doped at a concentration greater than $1 \times 10^{20}$ atoms/cm$^3$ in yet another embodiment. In one example, layer 406 has a thickness of 350 A. The silicon can be deposited and then doped or it can be doped in-situ. As will be described below, the conductivity type of the various layers can be modified in different implementations. For simplicity, layer 406 is referred to as an N+ layer hereinafter but in different embodiments can be of a different conductivity type, for example P+ type polysilicon.

Semiconductor layer 408 is an undoped intrinsic silicon material having a thickness of about 50 A in one embodiment. It is noted that intrinsic layer 408 may not be perfectly electrical neutral and thus can include lightly doped silicon in various implementations. Reference to an intrinsic material is intended to include such materials as a lightly doped N-region. In one example, layer 408 has a thickness of 400 A. Layer 410 is a silicon layer having a second conductivity type opposite of the conductivity type of layer 406. In one example, layer 410 is a heavily doped P+ type polysilicon layer having a thickness of about 300 A. Layer 410 can be doped with p-type impurities at concentrations similar to the n-type concentrations used for layer 406.

A pad layer 412 is formed over the semiconductor layer stack. The pad layer is used in the formation of the subsequent pattern used for etching the semiconductor layer stack and conductor layer. In one example, the pad layer is a semiconductor layer of silicon nitride deposited to a depth of about 2500 A. The particular material and thickness of layer 412 will vary by embodiment depending upon the particular type of patterning to be used. A first pattern is formed over the semiconductor layer stack and pad layer as shown in FIGS. 4B-4E. Different techniques can be used to form the pattern. In one example, the pattern is formed of strips of photo resist using conventional photo lithography techniques. Photo-masking spacer assisted patterning and nano imprint masking technologies can also be used. In FIG. 4B, strips 414 of oxide such as $SiO_2$ elongated in the y-direction over the pad layer 412. The oxide is tetraethyl orthosilicate (TEOS) in one example. The strips can be formed by forming a layer of advanced patterning film (APF) such as amorphous carbon followed by a layer of sacrificial TEOS. Over the sacrificial TEOS layer is formed a sacrificial high temperature oxide layer (HTO) and a thin layer of spin-on glass (SOG) oxide. Strips of photo resist extending in the y-direction are formed over the SOG layer and using the photo resist, the SOG and sacrificial HTO layers are etched followed by etching the sacrificial TEOS layer to form strips 414. After forming the strips, any remaining SOG and sacrificial HTO material is removed.

An optional slimming process for strips 414 is depicted in FIG. 4C. For example, a wet etch process is used to decrease the dimension of the oxide strips in the x-direction in one example. After the optional slimming process, spacers are formed along the substantially vertical side walls of strips 414 as shown in FIG. 4D. Spacers 416 can be formed by depositing a layer of polysilicon using conformal processes to form polysilicon along the vertical side walls of strips 414 and over the exposed portions of layer 412. Reactive ion etching or other suitable processes can be used to etch back the polysilicon layer to form spacers 416. In the disclosed example, the spacers have a dimension in the x-direction that is equal to the dimension of strips 414 in the x-direction and include an equal spacing therebetween, also equal to the dimension of strips 414.

The sacrificial strips of oxide 414 are removed after forming spacers 416 as shown in FIG. 4E to complete the pattern. In one example, a wet chemical etch is used to selectively strip the oxide from the pad layer 412. Spacers 416 form a first pattern for etching the semiconductor layer stack and first conductor layer. Spacers 416 are elongated in the y-direction repeating with spaces therebetween in the x-direction. This pattern may be described as x-direction patterning because of its repetition in the x-direction. Using the spacers 416 as a mask, the underlying layer stack is etched as shown in FIG. 4F. Etching proceeds through pad layer 412, semiconductor layers 410, 408 and 406, barrier metal layer 404 and first conductor layer 402. Any suitable etch process can be used for etching the layer stack. Combinational etch processes may be used to etch the different layers with various selectivities.

Etching conductor layer 402 forms a first set of conductors 402a, 402b, 402c and 402d elongated in the y-direction with spaces therebetween in the x-direction. Semiconductor layer stack lines 403s1, 403s2, 403s3 and 403s4 elongated in the y-direction are formed over each of the underlying first conductors as a result of the common etch process used in their formation. The barrier metal layer is not denoted as part of the layer stack lines because it will remain elongated with the underlying conductors instead of undergoing further etching as with the layer stack lines. However, the barrier metal layer can be considered part of the layer stack lines as well. Layer stack line 403s1 includes strips 406s1, 408s1 and 410s1 overlying conductor 402a. Layer stack line 403s2 includes strips 406s2, 408s2 and 410s2 overlying conductor 402b. Layer stack line 403s3 includes strips 406s3, 408s3 and 410s3 is formed over conductor 402c1. Layer stack line 403s4 includes strips 406s4, 408s4 and 410s4 overlying conductor 402d1. The semiconductor layer stack lines are self aligned with the underlying strips of titanium nitride and first conductors. Because of the common etch process used in their formation, the substantially vertical side walls of the stacks elongated in the y-direction and extending in a plane substantially vertical to the substrate surface are self-aligned with the substantially vertical side walls of the first set of conductors and the overlying titanium nitride strips.

After etching and removing spacers 416, a gap fill material 420 is deposited as shown in FIG. 4G. Material 420 fills the spaces in the x-direction between conductors and semiconductor layer stack lines. The gap fill material 420 is planarized to about the upper surface of the strips of pad layer 412 using a process such as chemical-mechanical polishing (CMP). Different materials can be used for the gap fill in various embodiments. In one example, $SiO_2$ is deposited using CVD or another suitable process. After planarizing gap fill material 420, the strips of pad layer 412 are removed as shown in FIG. 4H. A chemical wet etch process can be used in one embodiment with a selectivity for removing the pad layer material without significant portions of the gap fill material 420.

Strips of state change material are formed over the individual semiconductor layer stack lines as shown in FIG. 4I. A damascene process is used in this example to fill the trenches that result from the removal of the pad layer with the state change material. The strips are elongated in the y-direction over the individual semiconductor layer stack lines. Using chemical-mechanical polishing, excess material is removed to form individual strips 422s1, 422s2, 422s3 and 422s4 of the state change material. The individual strips form part of the corresponding semiconductor layer stack lines below.

FIG. 4J is an overhead view of the wafer at the point of processing depicted in FIG. 4I. The strips 422S1, 422S2, 422S3 and 422S4 of state change material at the top of each layer stack line are depicted, elongated in the y-direction with spaces therebetween in the x-direction. The spaces between are filled with the gap fill material 420.

FIG. 4K is a cross-sectional view taken along line A-A in FIG. 4I through conductor 402a, barrier metal strip 404S1 and the overlying layer stack line. An optional barrier metal layer 424 is next deposited over the wafer. Barrier metal layer 424 is titanium nitride in one example. A second conductor layer 426 is formed over barrier metal layer 424. Notably, the second conductor layer is formed with a reduced thickness in the vertical direction as compared with conductor layer 402. In one example where conductor layer 402 is formed with a thickness of about 3000 A, conductor layer 426 is formed to a thickness of about 1500 A. Note that the half dimension of layer 426 as compared to layer 402 is exemplary only. Other ratios can be used in different examples. Moreover, different thicknesses than those described can be used. In one example, layer 426 is tungsten.

A second pattern is formed as shown in FIG. 4L for etching the second conductor layer and the underlying semiconductor layer stack lines. In the described example, the pattern includes spacers 430 which are formed along sacrificial features 428. The spacers and sacrificial features can be formed as earlier described with respect to the first pattern. After forming the spacers along the sacrificial features, the sacrificial features are removed and the spacers used as a mask for etching the underlying layers as shown in FIG. 4M. This second pattern is orthogonal to the first pattern, comprising a y-direction pattern of strips elongated in the x-direction. Etching second conductor layer 426 forms strips 426s1, 426s2, 426s3 and 426s4. Each of these strips forms a first portion of a conductor for a second set of array lines. Etching barrier metal layer 424 forms strips 424s1, 424s2, 424s3 and 424s4. Etching proceeds through strip 422s1 of the state change material to form state change elements 422a1, 422a2, 422a3 and 422a4. Etching proceeds through a portion of the semiconductor layer stack lines. Strip 410S1 is etched through completely to form regions 410a1, 410a2, 410a3 and 410a4. Etching proceeds through a portion of semiconductor layer 408S1. Etching through a portion of this layer forms regions 409a1, 409a2, 409a3 and 409a4. A second portion of layer 408s1 is not etched, leaving a continuous strip 408S1. Regions 422a1, 410a1 and 409a1 form a pillar 427a1 after having been etched in the y-direction. Regions 422a2, 410a2 and 408a2 form a pillar 427a2. Regions 422a3, 410a3 and 408a3 form a pillar 427a3. Regions 422a4, 410a4 and 408a4 for a pillar 427a4. In another embodiment, strip 408S1 can be completely etched so that its entire thickness is divided into regions for each pillar. Pillar 427a1 includes a state change element 422a1 and a diode comprising a first electrode 406S1 and a second electrode 410a1 separated by intrinsic regions 408a1 and 408S1. Pillar 427a2 includes a state change element 422a2 and a diode comprising a first electrode 406S1 and a second electrode 410a2 separated by intrinsic regions 408a2 and 408S1. Pillar 427a3 includes a state change element 422a3 and a diode comprising a first electrode 406S1 and a second electrode 410a3 separated by intrinsic regions 408a3 and 408S1. Pillar 427a4 includes a state change element 422a4 and a diode comprising a first electrode 406S1 and a second electrode 410a4 separated by intrinsic regions 408a4 and 408S1.

The state change elements formed in each pillar (e.g., state change elements 422a1-422a4) can vary by embodiment and include different types of materials to store data through representative physical states. The state change elements can include resistance change materials, phase change resistive materials, etc. A semiconductor or other material having two or more detectable levels resistance can be used to form a passive storage element. The state change elements can include materials capable of a single resistance change to form a one-time programmable memory or materials capable of reversible resistance changes to form a re-writable memory. A range of resistance values can be assigned to a physical data state to accommodate differences amongst devices as well as variations within devices after set and reset cycling. The terms set and reset are typically used, respectively, to refer to the process of changing an element from a high resistance physical state to a low resistance physical state (set) and changing an element from a low resistance physical state to a higher resistance physical state (reset).

A variety of materials exhibit resistivity change behavior suitable for implementing the state change elements. Examples include, but are not limited to, doped semiconductors (e.g., polycrystalline silicon, more commonly polysilicon), transition metal oxides, complex metal oxides, programmable metallization connections, phase change resistive elements, organic material variable resistors, carbon polymer films, doped chalcogenide glass, and Schottky barrier diodes containing mobile atoms that change resistance. State change elements formed from carbon can include any combination of amorphous and graphitic carbon. In one aspect, the carbon is deposited as a carbon film. However, it is not required that a carbon state change element be a carbon film. In one aspect, the state change element can include a carbon nanotube. One type of carbon nanotube stores a charge based on position of a "guest" molecule in the nanotube. The position of the guest molecule, which remains stable even without energy supplied to the memory cell, modifies the electric properties of the nanotube. One stable position of the guest molecule results in a high current, whereas the current is measurably lower in at least one other position. In one embodiment, the state change element 104 is $Ge_2Sb_2Te_5$ (GST). GST has a property of reversible phase change from crystalline to amorphous-allowing two levels per cell. However, quasi-amorphous and quasi-crystalline phases may also be used to allow additional levels per cell with GST. The resistivity of the aforementioned materials in some cases may only be set in a first direction (e.g., high to low), while in others, the resistivity may be set from a first level (e.g., higher resistance) to a second level (e.g., lower resistance), and then reset back to the first resistivity level. As a discreet device or element may have a resistance and different resistance states, the terms resistivity and resistivity state are used to refer to the properties of materials themselves. Thus, while a resistance change element or device may have resistance states, a resistivity change material may have resistivity states.

In one embodiment, the state change elements are antifuses. An antifuse is manufactured in a high resistance state and can be popped or fused to a lower resistance state. An antifuse is typically non-conductive in its initial state and exhibits high conductivity with low resistance in its popped or fused state. Various types of antifuses can be used, including but not limited to dielectric rupture antifuses, intrinsic or lightly doped polycrystalline semiconductor antifuses and amorphous semiconductor antifuses, for example. In addition to its data storage ability, an antifuse can serve to set the on-resistance of the memory cell in at an appropriate level relative to the read-write circuitry associated with the cell. These circuits are typically used to pop the antifuse and have an associated resistance. Because these circuits drive the voltages and current levels to pop the antifuse, the antifuse tends to set the memory cell in an appropriate on-resistance state for these same circuits during later operations.

Looking back at FIG. 4M, the second conductor layer 426 and the second barrier metal layer 424 are etched in the same process as layers 422, 410 and 408. By etching these layers in the same process, the substantially vertical side walls of strips 426S1 and 424S1 are substantially self aligned with the substantially vertical side walls of pillar 427*a*1 Similarly, strips 426S2 and 424S2 have side walls that are self aligned with the side walls of pillar 427*a*2, strips 426S3 and 424S3 have side walls that are self aligned with the side walls of pillar 427*a*3 and strips 426S4 and 424S4 have sidewalls that are self aligned with the side walls of pillar 427*a*4.

FIG. 4N depicts the wafer after depositing a second gap fill material 432. Gap fill material 432 can be different materials as described with the first gap fill material 420. The gap fill material is deposited to fill the spaces between adjacent structures in the y-direction. After depositing the gap fill material, chemical-mechanical polishing can be used to create a substantially planar and flat surface between the gap fill material and second conductor layer strips 426*s*1, 426*s*2, 426*s*3 and 426*s*4.

FIG. 4O is an overhead view of the wafer at the point in processing depicted in FIG. 4N. Strips 426S1, 426S2, 426S3 and 426S4 of the second conductor layer are elongated in the x-direction with spaces therebetween in the y-direction. Insulating material 432 fills the spaces between adjacent strips of the second conductor layer. FIG. 4P is also an overhead at the point in processing of FIG. 4N. In this depiction, the second conductor layer strips 426S1, 426S2, 426S3 and 426S4 and the barrier metal strips 424S1, 424S2, 424S3 and 424S4 are omitted to reveal the underlying charge storage regions. State change regions 422*a*1, 422*a*2, 422*a*3 and 422*a*4 are shown in a repeating pattern in the y-direction. These regions are part of pillars 427*a*1, 427*a*2, 427*a*3 and 427*a*4 which are formed over first conductor 402*a*. Also shown are state change regions 422*b*1, 422*b*2, 422*b*3 and 422*b*4. These regions are not visible in the cross-section of FIG. 4N but are part of the pillars formed over first conductor 402*b*. FIG. 4Q is a corresponding view to that of FIG. 4N taken along line B-B therein.

FIG. 4R depicts the system as shown in FIG. 4N after additional processing. A third conductor layer 442 is deposited over the upper surfaces of strips 426*s*1-426*s*4 and intervening gap fill material 432. A third barrier metal layer 444 is formed over the third conductor layer 442. A second semiconductor layer stack is then formed over layer 444. In the disclosed example, the second semiconductor layer stack is formed as described with respect to the first semiconductor layer stack. A first semiconductor layer 446 having a first conductivity type is formed over layer 444 followed by an intrinsic layer 448 and a second semiconductor layer 450 having a second conductivity type. As earlier described, different material types can be used in various examples. Continuing with the earlier example, layer 446 can be a heavily doped N+ type material and layer 450 a heavily doped P+ type material with layer 448 being an intrinsic or lightly doped N− type layer. After forming the second semiconductor layer stack, a second pad layer 452 is formed over layer 450. Different pad materials can be used. In one example, layer 452 is silicon nitride. A third pattern is then formed over layer 452. This third pattern can be formed as described with respect to the earlier first and second patterns. In the disclosed example, the pattern includes spacers 456 which are formed along the substantially vertical side walls of sacrificial features 454. After removing features 454, the spacers server as the third pattern. The third pattern is in the same direction as the second pattern, comprising a repeating pattern in the y-direction of strips elongated in the x-direction.

FIG. 4S depicts the system after removing sacrificial features 454 and etching layers 452-442 using spacers 456 as a mask. Etching proceeds all the way through layers 452, 450, 448, 446, 444 and 442 to the level of strips 426S1-426S4 from the second conductor layer. After etching, spacers 456 are removed. Layer 452 is etched into strips 452S1, 452S2, 452S3 and 452S4. Layer 450 is etched into strips 450S1, 450S2, 450S3 and 450S4. Layer 448 is etched into strips 448S1, 448S2, 448S3 and 448*s*4. Layer 446 is etched into strips 446S1, 446S2, 446S3 and 446S4. Layer 444 is etched into strips 444S1, 444S2, 444S3 and 444S4. Layer 442 is etched into strips 442S1, 442S2, 442S3 and 442S4. Strips 452S1, 450S1, 448S1 and 446S1 form semiconductor layer line stack 405*s*1, strips 452S2, 450S2, 448S2 and 446S2 form semiconductor layer line stack 405*s*1, strips 452S3, 450S3, 448S3 and 446S3 form semiconductor layer line stack 405*s*3 and strips 452S4, 450S4, 448S4 and 446S4 form semiconductor layer line stack 405*s*4. Strips 444S1, 444S2, 444S3 and 444S4 are not denoted as part of the layer stack lines since they will not undergo further etching as with the other strips. Again, these strips could be considered part of the layer stack lines as well.

Recall that strips 426S1, 426S2 426S3 and 426S4 were described as first portions of conductors for the second set of array lines. Strips 442S1, 442S2, 442S3 and 442S4 form the second portions of the conductors for the second set of array lines. Together, strips 426S1 and 442S1 form second conductor 443*a*. Similarly, strips 426S2 and 442S2 form second conductor 443*b*, strips 426S3 and 442S3 form second conductor 443*c* and strips 426S4 and 442S4 form second conductor 443*d*. In this manner, each second conductor is defined by two separate masking and etch steps. As such, the first portions 426S1, 426S2, 426S3 and 426S4 of the second conductors include two substantially vertical sidewalls self-aligned with two opposing sidewalls of the underlying pillars 427*a*1-427*a*4. The second portions 442S1, 442S2, 442S3 and 442S4 of the second conductors include two substantially vertical sidewalls self-aligned with two opposing sidewalls of the overlying layer stack lines 405*s*1-405*s*4. These upper layer stack lines are later etched into pillars which will thus have sidewalls self-aligned with the second portions of the second conductors by virtue of the common etch to define the layer stack lines and second portions of the conductors.

After etching, a third gap fill material 458 is deposited to fill the spaces between adjacent structures in the y-direction as depicted in FIG. 4T. After depositing gap fill material 458, CMP is applied to create a substantially planar and conformal surface comprising strips 452S1-452S4 and the intervening gap fill material 458. FIG. 4U depicts the system after removing pad layer strips 452*s*1-452*s*4 and depositing a state change material to fill the trenches resulting from the removal of strips 45S1-452S4. A first strip 460*s*1 of state change material is formed in the trench at the top of layer stack line 405*a*1. A second strip 460S2 of state change material is formed in the trench at the top of layer stack line 405*a*2, a third strip of state change material 460*s*3 is formed in the trench at the top of layer stack line 405*a*3, and a fourth strip 460*s*4 of state change material is formed in the trench at the top of layer stack line 405*a*4. After forming the strips of state change material, another chemical-mechanical polishing process is applied to create a substantially planar and uniform surface comprising upper surfaces of strips 460*s*1-460*s*4 and intervening gap fill material 458.

Although not shown, processing continues as earlier described with respect to FIG. 4L after planarizing. An additional barrier metal layer followed by a fourth conductor layer can be deposited and then etched as shown in FIGS. 4M and 4N. The first portion of conductors for a third set of array lines are created. This etch process will also etch layer stack lines 405s1-405s4 to form a set of pillars at this second memory level. This process is repeated for as how many layers are desired to be formed.

Figure 5:
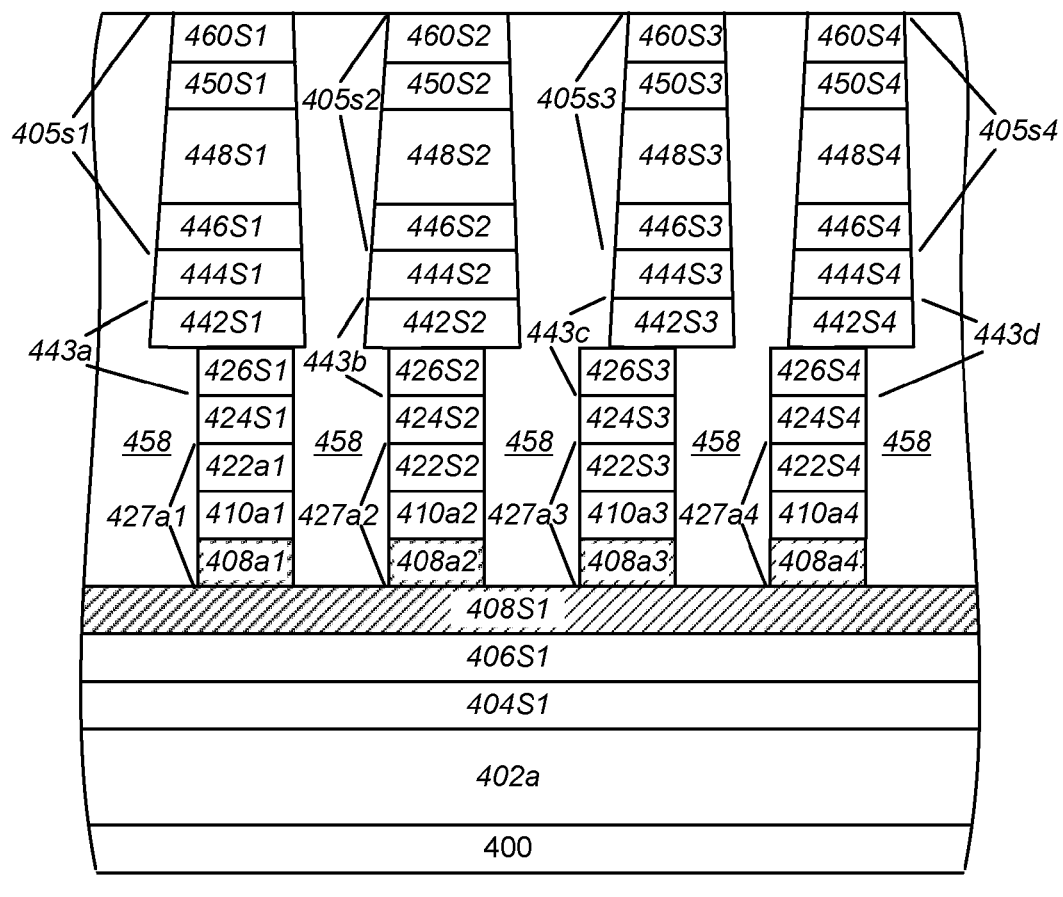
FIG. 5 is a cross-sectional view of a monolithic three-dimensional non-volatile memory fabricated in accordance with one embodiment.

FIG. 5 is a cross-sectional view in the y-direction illustrating the tolerance for mis-alignment that the presently disclosed technology provides. Recall that pillar 427a1 is formed in a second etch process that includes the formation of the first portion 426S1 of the second conductor line 443a in self-alignment with the underlying pillar structure. The semiconductor layer stack line 405s1 is formed in a third etch process that includes the formation of the second portion 442S1 of conductor line 443a. In the example shown in FIG. 5, the second etch process and third etch process are not aligned, causing substantial mis-alignment between the second layer stack lines 405s1-405s4 and the first portions of the second conductors 443a-443d. Because the second portions of the second conductors are formed during the third etch process and contact the first portions 426S1-426S4 of the second conductors, substantial mis-alignment is easily tolerated. Conductor strip 442S1 is self-aligned with the x-direction sidewalls of overlying strips 444S1, 446S1, 448S1 and 450S1 which will become the pillars of a second memory level. In this manner, both memory levels are aligned with one of the conductor lines, the second memory level being aligned with conductor line 442S1 and the first memory level being aligned with conductor line 426S1. Conductor line 442S1 and 426S1 combine to form a common array line such that both memory levels are aligned with the array line even though the two memory levels themselves are mis-aligned.

Figure 6A:
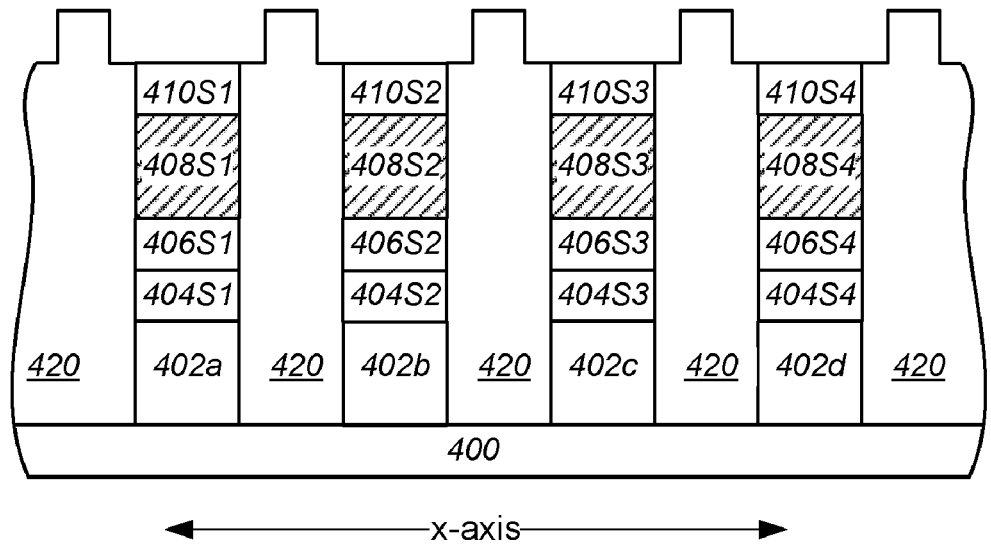
FIGS. 6A-6B are cross-sectional views describing a technique for increasing the size of a state change element relative to its corresponding pillar structure.
Figure 6B:
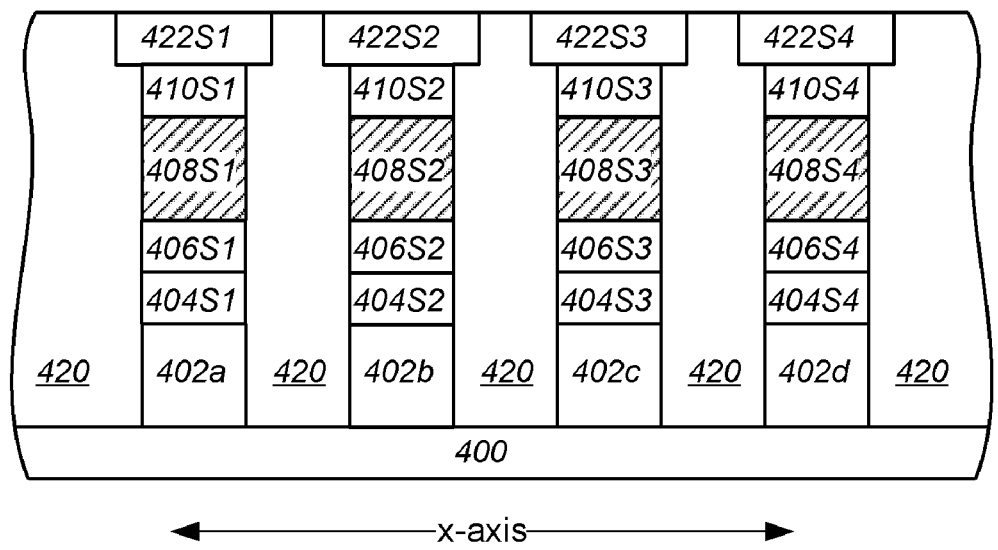

FIGS. 6A-6B are cross-sectional views of an optional step that can be used to increase the width of the state change element in the x-direction. The processes depicted in FIGS. 6A-6B can be performed after the operations depicted in FIG. 4H as an alternate to FIG. 4I. Recall that FIG. 4H depicts the array after planarizing the gap fill material and removing pad layer strips 412S1-412S4. Removing the pad layer strips results in strips of oxide extending in the y-direction over the gap fill material at locations adjacent in the x-direction to strips 410S1-410S4. Before filling the resulting spaces with the state change material, the strips of oxide are slimmed as shown in FIG. 6A. By slimming the oxide strips, larger spaces in the x-direction are created over the semiconductor layer stack lines. A chemical wet etch or other suitable process can be used to etch the oxide and decrease its x-direction dimension. After slimming the oxide, the gaps are filled with the state change material, followed by CMP as shown in FIG. 6B. The resulting strips of state change material have a larger dimension in the x-direction than the strips formed as shown in FIG. 4I. After forming the strips of state change material, processing can proceed as earlier described.

Figure 7A:
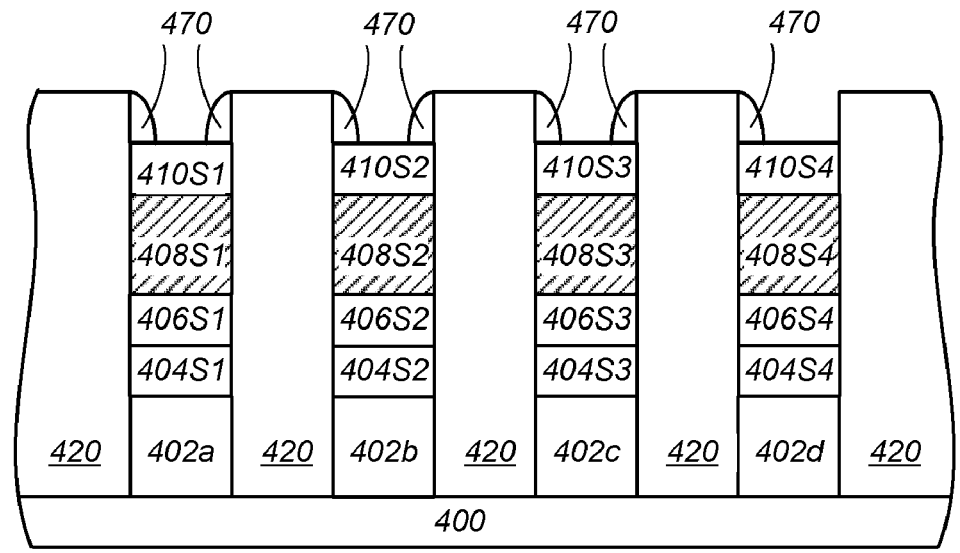
FIGS. 7A-7B are cross-sectional views describing a technique for decreasing the size of a state change element relative to its corresponding pillar structure.
Figure 7B:
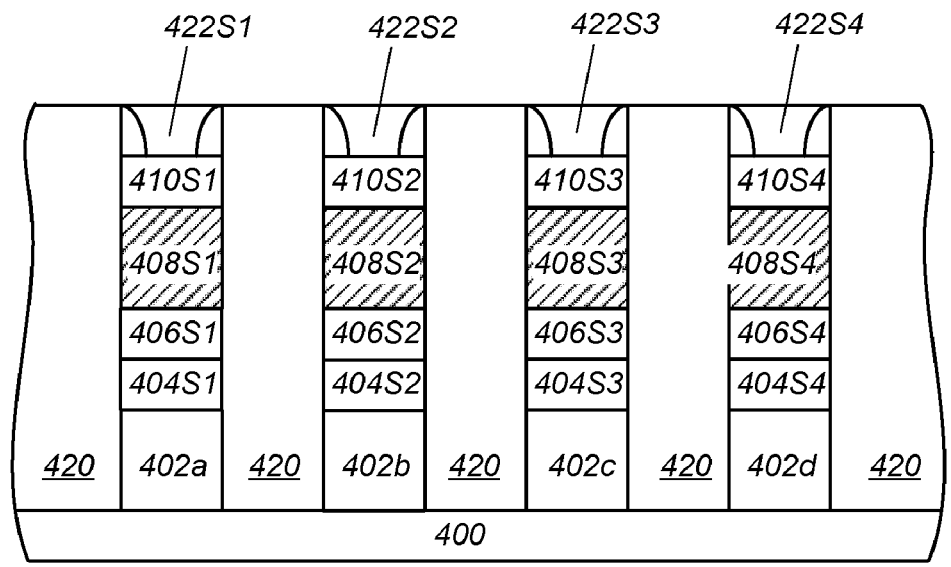

FIGS. 7A-7B are cross-sectional views of an optional step that can be used to decrease the width of the state change element in the x-direction. These processes can also be performed after the operations depicted in FIG. 4H as an alternate to FIG. 4I. After removing the pad layer strips 412S1-412S4, additional oxide is deposited and etched back to form spacers 470 as shown in FIG. 7A. The spacers are formed along the vertical sidewalls of the gap fill material resulting from removal of the nitride strips. The spacers increase the width of the oxide material in the x-direction. After increasing the width of the oxide, the state change material is deposited in the resulting gaps as shown in FIG. 7B. After depositing the state change material, CMP is applied to planarize the surface and form strips 422S1, 422S2, 422S3 and 422S4 of the state change material elongated in the y-direction. The resulting strips of state change material have a smaller dimension in the x-direction than the strips formed as shown in FIG. 4I. Processing can proceed as earlier described after forming the strips of state change material.

Figure 8A:
FIGS. 8A-8C are cross-sectional views of a monolithic three-dimensional non-volatile memory illustrating a detailed fabrication sequence according to one embodiment.
Figure 8B:
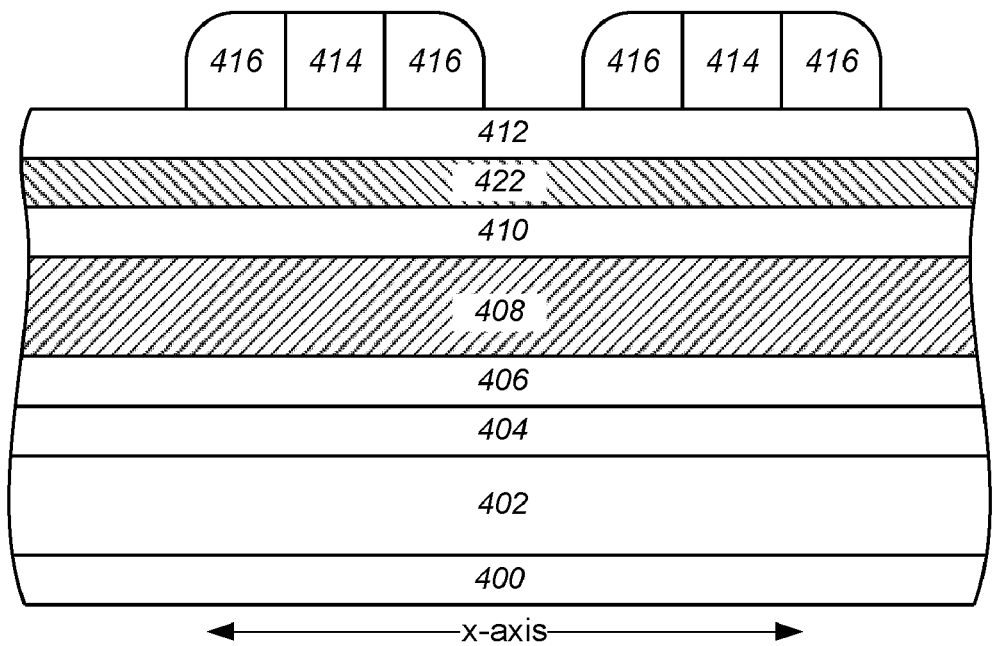
Figure 8C:
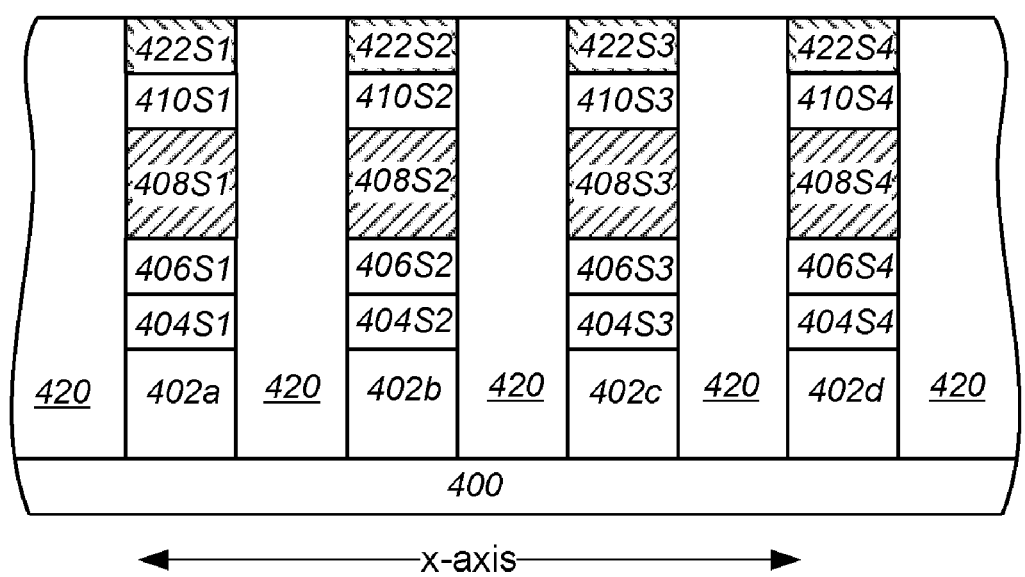

In FIGS. 4A-4U, the state change material is formed using a damascene process. Strips of the state change material are formed over previously formed semiconductor layer stack lines elongated in the y-direction. The state change material need only be etched once, in the y-direction, to subdivide these strips along their length as part of forming pillars from the previously formed semiconductor layer stack lines. It is also possible to form the state change material with the initial semiconductor layer stack and etch it twice with the semiconductor layers to form pillars including a state change element. FIGS. 8A-8C are cross-sectional views depicting the formation of the state change material in this manner. FIG. 8A depicts the initial formation of the conductor layer 402, barrier metal layer 404 and semiconductor layers 406, 408 and 410 over substrate 400 as described in FIG. 4A. In FIG. 8A, a layer 422 of state change material is deposited over semiconductor layer 410 (e.g., P+ polysilicon) prior to forming the nitride pad layer 412. The state change material thus forms part of the initial layer stack.

A spacer pattern for etching the layer stack is formed as shown in FIG. 8B. Sacrificial strips of oxide 414 are formed, followed by forming spacers 416 along the substantially vertical sidewalls of the strips. The spacers are polysilicon in one embodiment. The sacrificial strips of oxide are then removed, leaving the spacers as a pattern elongated in the y-direction over the layer stack. Using the spacers as a mask, the layer stack is etched as shown in FIG. 8C. Like the earlier embodiment, etching results in layer stack lines 403s1-403s4 that include strips of layers 406-422. Unlike the earlier embodiment, the layer stack lines also include strips 422S1-422S4 of the state change material. After forming the layer stack lines, the spaces between adjacent lines are filled with a gap fill material 420, followed by chemical mechanical polishing using the nitride layer as a CMP stop layer. The nitride strips are then removed, followed by an oxide etch back to recess the oxide. The process then proceeds as described in FIGS. 4K-4U.

FIGS. 9A-9F are cross-sectional views depicting the fabrication of a memory array in accordance with another embodiment of the presently disclosed technology. In this embodiment, a double deposition and etch process for the array lines is not used. After forming the first layer array lines from a metal, the subsequent array lines are formed from polysilicon. The polysilicon is deposited and etched, then silicidized to form a highly conductive array line with low resistance. This embodiment shares a common feature with the earlier described embodiments in that after forming the first array line layer during a first etch process in a first direction, two etch processes in a second orthogonal direction are performed before etching again in the first direction.

Figure 9A:
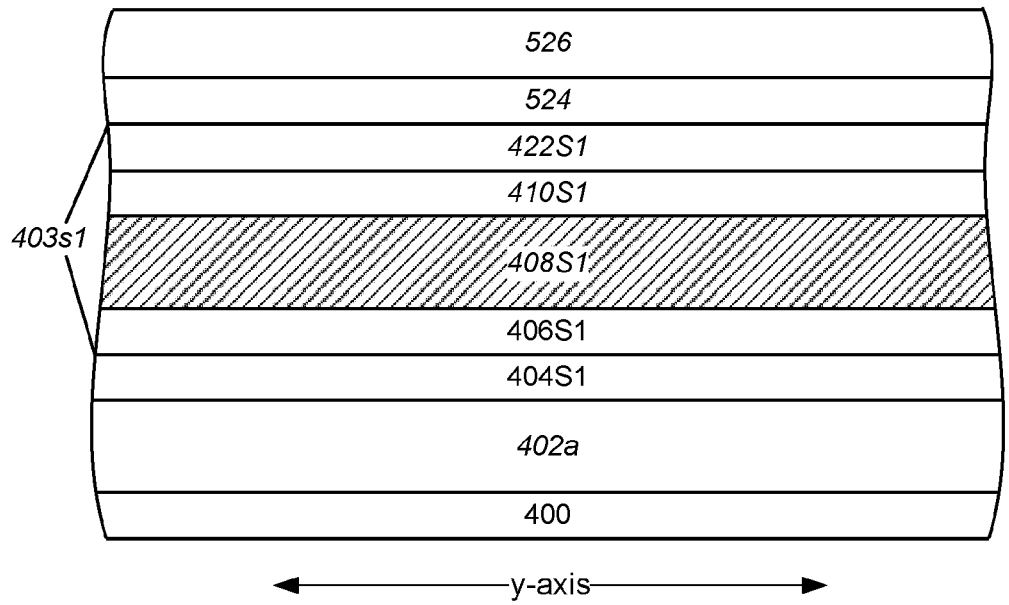
FIGS. 9A-9F are cross-sectional views of a monolithic three-dimensional non-volatile memory illustrating a detailed fabrication sequence according to one embodiment that includes a silicidization process.

FIG. 9A depicts the array after an initial set of processing steps have been performed to form a first set of array lines and set of semiconductor layer stack lines. For example, the processes depicted in FIGS. 4A-4I can be performed (the processes in FIGS. 8A-8C can optionally be used), resulting in array lines 402a-402d and semiconductor layer stack lines elongated in the y-direction. FIG. 9A is a cross-sectional view in the y-direction, depicting one conductor and one semiconductor layer stack line. Conductor 402a is illustrated, with overlying layers 404S1, 406S1, 408S1, 410S1 and 422S1.

After forming these lines, a barrier metal layer 524 is deposited, followed by a layer 526 of polysilicon.

Figure 9B:
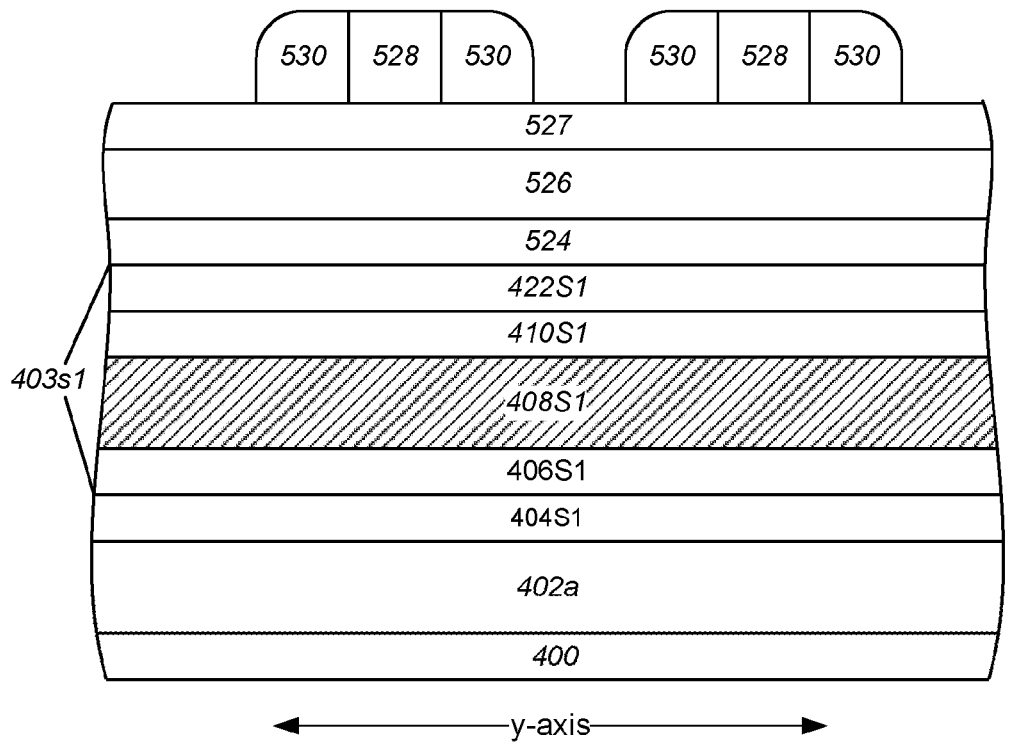

After forming the polysilicon layer, a pattern is applied for etching in the y-direction as shown in FIG. 9B. A nitride pad layer 527 (e.g., SiN) is formed over the polysilicon layer. Over the nitride layer is first formed sacrificial strips 528 of oxide elongated in the x-direction with spaces therebetween in the y-direction. The strips can be formed as earlier described. Spacers 530 are then formed along the x-direction extending sidewalls of the sacrificial oxide strips 508.

Figure 9C:
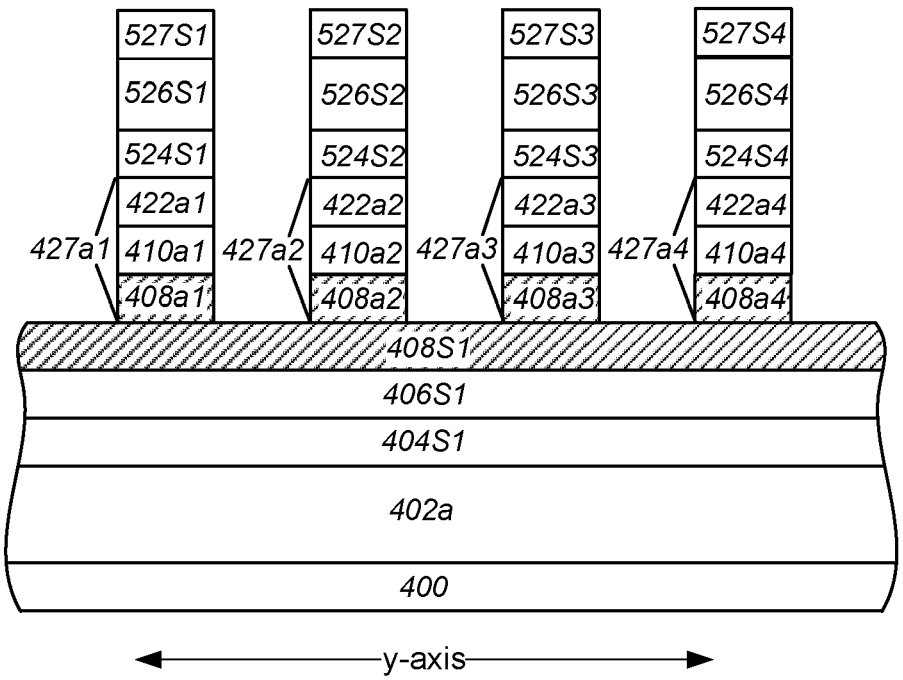
Figure 9D:
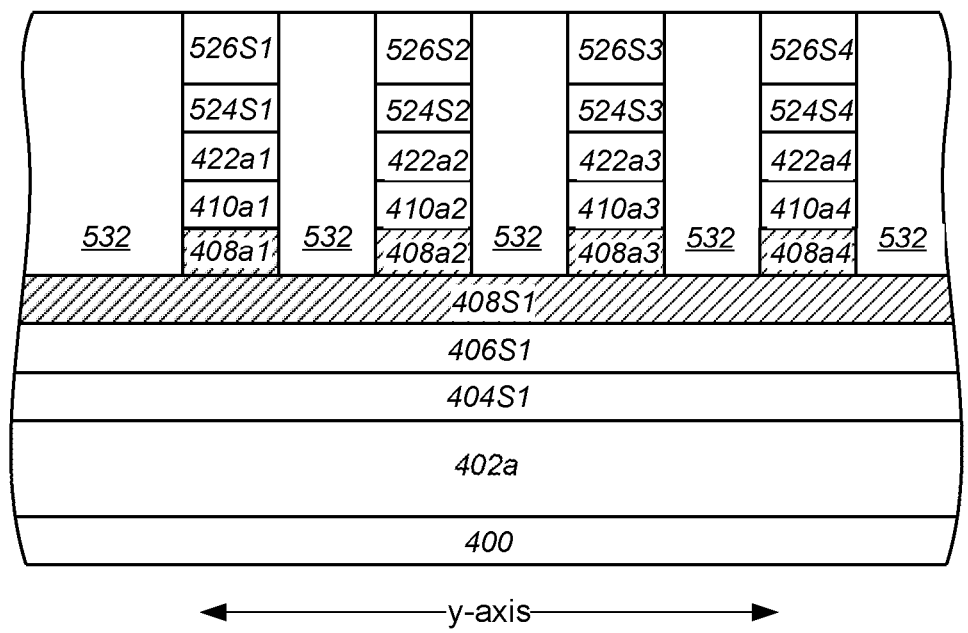

FIG. 9C depicts the array after removing the oxide strips, and etching a subset of the underlying layers using the spacers as a mask. Etching proceeds all the way through layers 527, 526, 524, 422S1 and 410S1. Etching proceeds partially through layer 408S1, stopping before completely etching this layer. Etching forms pillars 427a1-427a4. After etching, a gap fill material 532 is deposited to fill the spaces in the y-direction between adjacent pillars as shown in FIG. 9D. Chemical mechanical polishing is used to form a substantially planar surface with the intervening strips 526S1 of polysilicon after removing the SiN. Polishing exposes the upper surfaces of the polysilicon layer, which has been etched into strips 526S1-526S2.

After exposing the polysilicon, the polysilicon lines are formed into silicide lines using a suitable silicide process. The polysilicon can be fully silicided (FUSI) to form the silicide array lines. A self-aligned silicide process (salicide) is used in one embodiment. A thin metal layer is deposited over the array followed by thermal processing to form a silicide from the reaction of the metal and underlying polysilicon. Various silicides can be used. By way of non-limiting example, nickel silicide (NiSi) or copper silicide (Cu5Si) could be used.

Figure 9E:
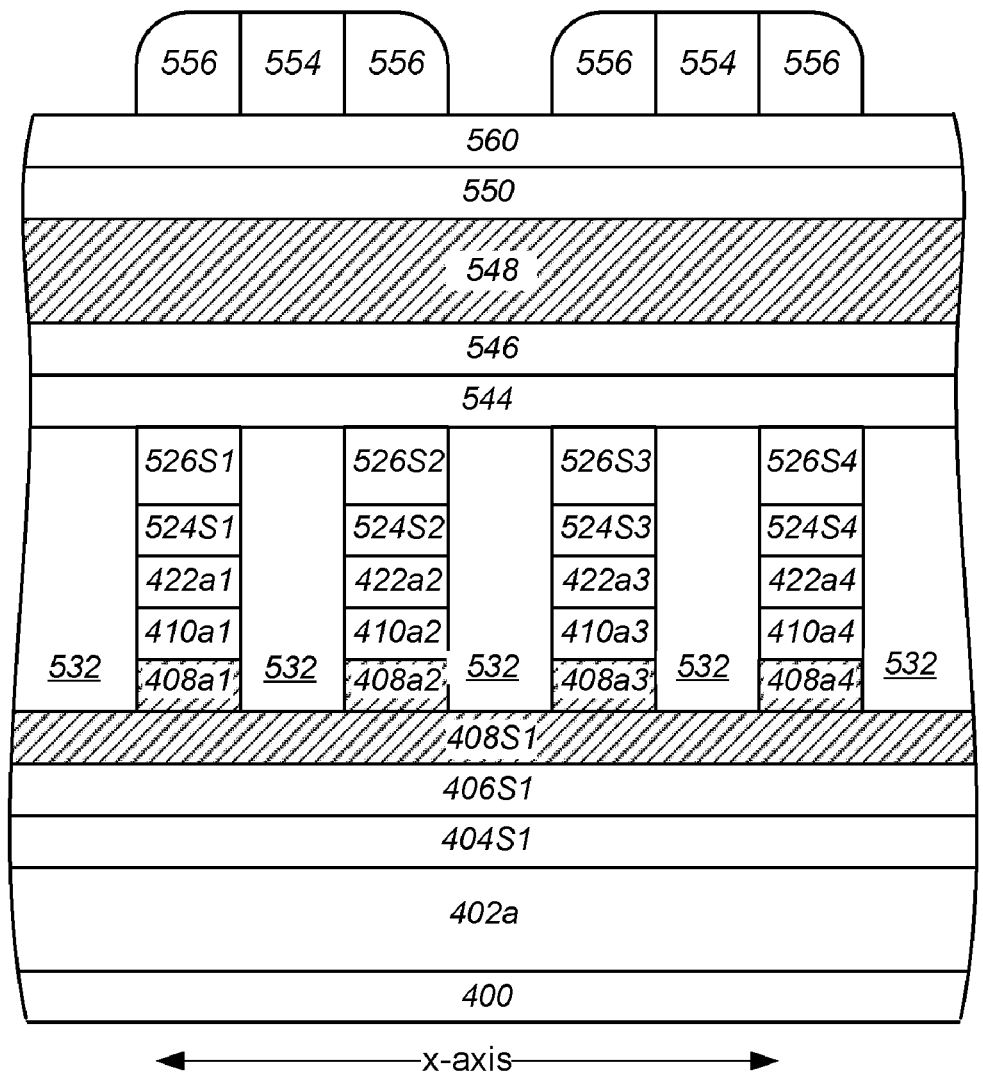
Figure 9F:
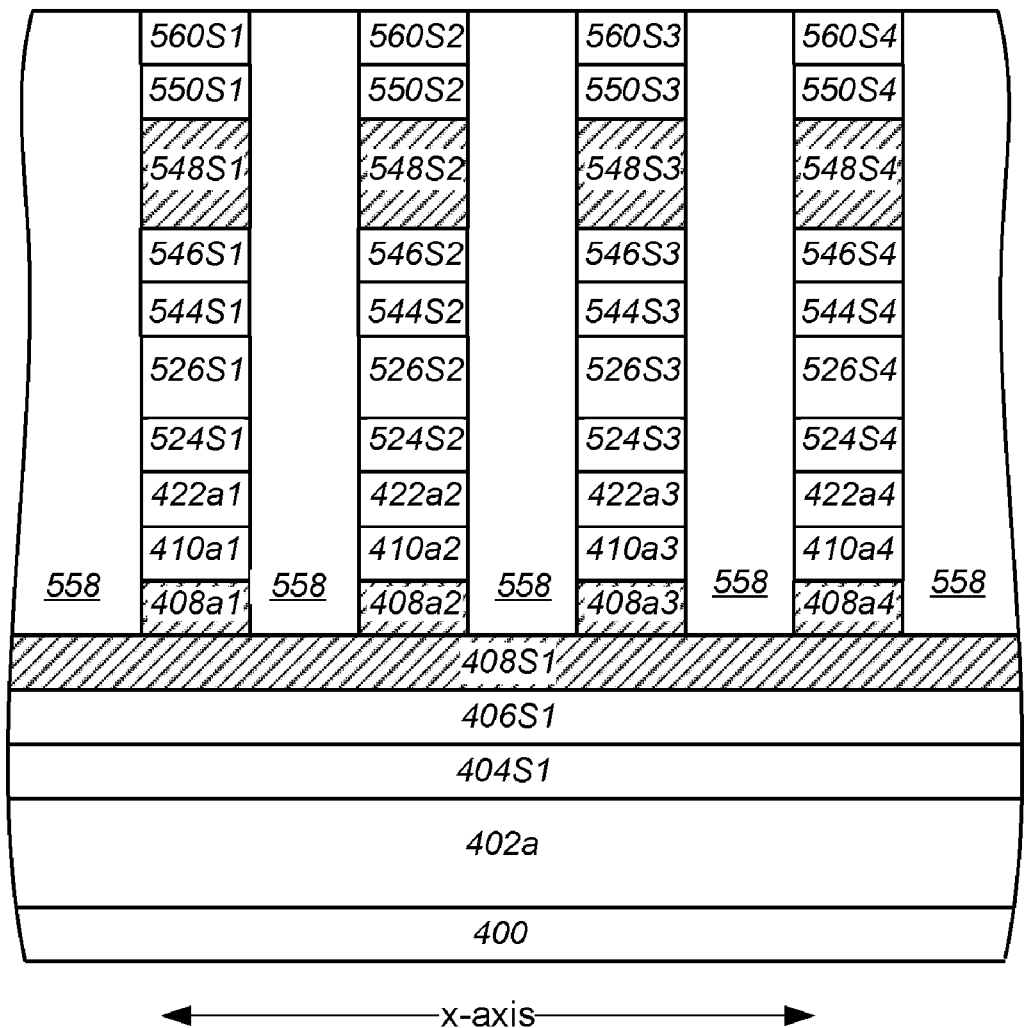

After forming the silicide array lines, processing continues as shown in FIG. 9E. A barrier metal layer 544 is formed over the array, followed by another series of semiconductor layers 546 (e.g., N+), 548 (e.g., N−), 550 (e.g., P+) and a layer of state change material 560. After forming these layers, a second y-direction pattern is formed for etching these layers into strips. The pattern is a spacer pattern in one embodiment formed as earlier described by first forming sacrificial oxide strips 554 then forming spacers 556 After removing the sacrificial oxide strips, the spacers are used as a mask to etch the underling layers as shown in FIG. 9G. Etching proceeds all the way through layers 560, 550, 548, 546, and 544. These strips are elongated in the x-direction with spaces therebetween in the y-direction. Processing can continue by depositing an additional silicon layer and etching in the x-direction to define a third set of array lines and a second set of pillars. After etching this silicon layer, silicidization can be performed on the array lines.

Figure 10A:
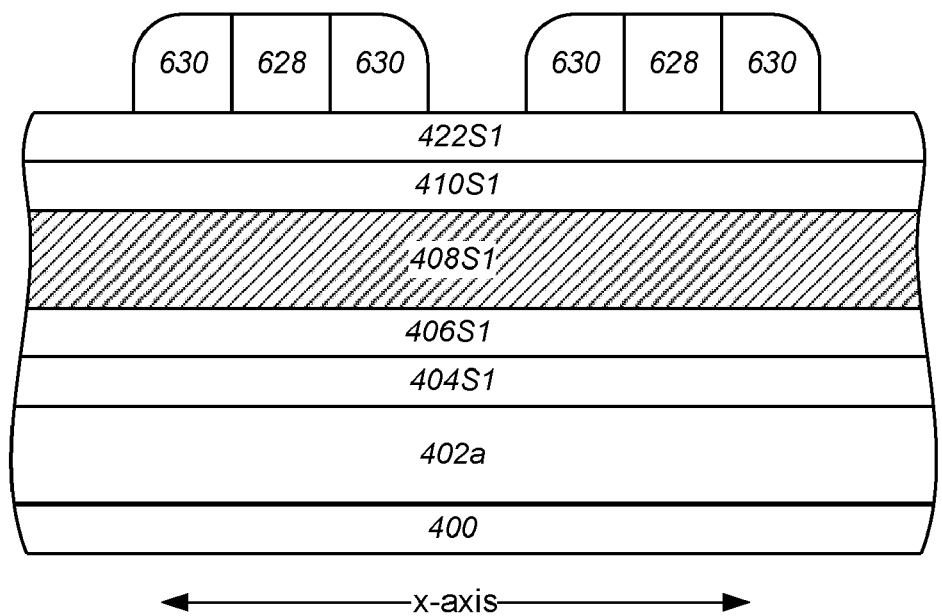
FIGS. 10A-10I cross-sectional views of a monolithic three-dimensional non-volatile memory illustrating a detailed fabrication sequence according to one embodiment that includes a damascene process.
Figure 10B:
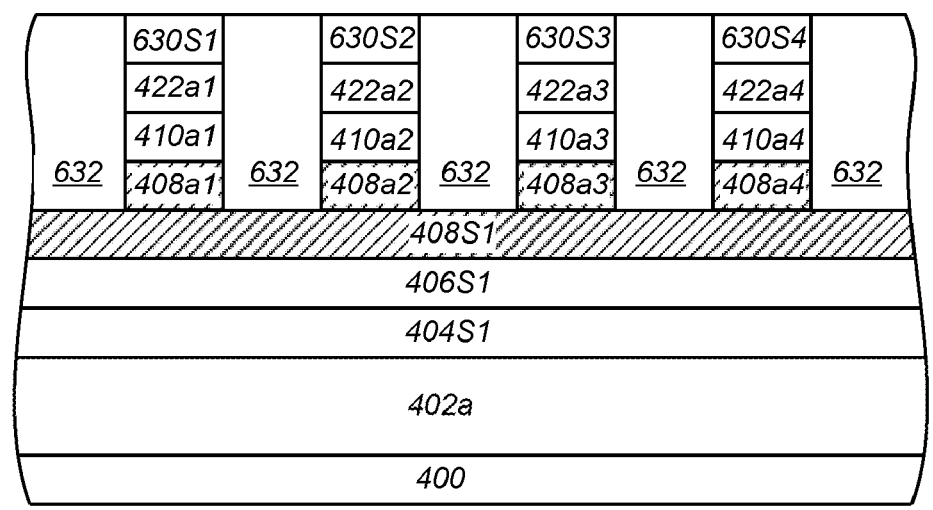
Figure 10C:
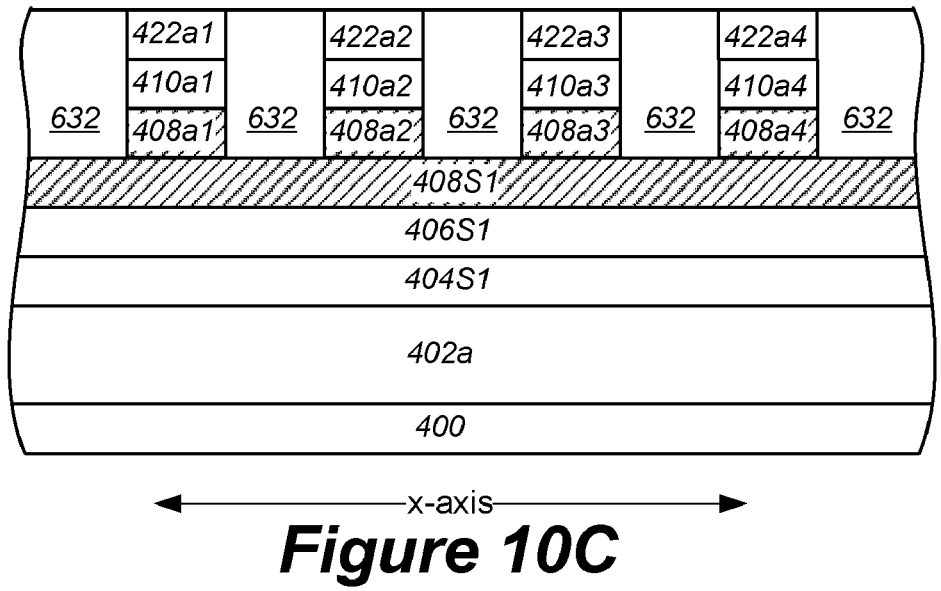

FIGS. 10A-10I depict an embodiment that includes the formation of the second and subsequent sets of array lines using damascene processes. FIG. 10A is a cross-sectional view through the memory array in the y-direction, depicting the memory after etching to form the first set of semiconductor layer stack lines. The view in FIG. 10A corresponds with that of FIG. 4K, before forming the barrier metal layer and second conductor layer. The steps outlined in FIGS. 4A-4I are used to form a first conductor 402a over substrate 400. Over conductor 402a is formed strip 404S1, strip 406S1, strip 408S1, strip 410S1 and strip 422S1. A second pattern for etching these strips is then formed. Sacrificial strips 628 of oxide are formed over the strip 422S1 of state change material and spacers 630 are formed along the sidewalls of the sacrificial strips as earlier described. In this particular example, the spacers are a nitride (e.g., SiN) material but other materials can be used. After forming the spacers, the sacrificial oxide features are removed and the underlying layers etched using the spacers as a mask as shown in FIG. 10B. Etching proceeds completely through strips 422S1 and 410S1 and partially through intrinsic layer 408S1. After etching, an insulating material 632 is used to fill the gaps between pillars adjacent in the y-direction. After filling the gaps, chemical mechanical polishing is used to create a substantially planar surface. After polishing, the remaining nitride spacer material is removed, followed by an etch back process to recess the insulating material as shown in FIG. 10C.

Figure 10D:
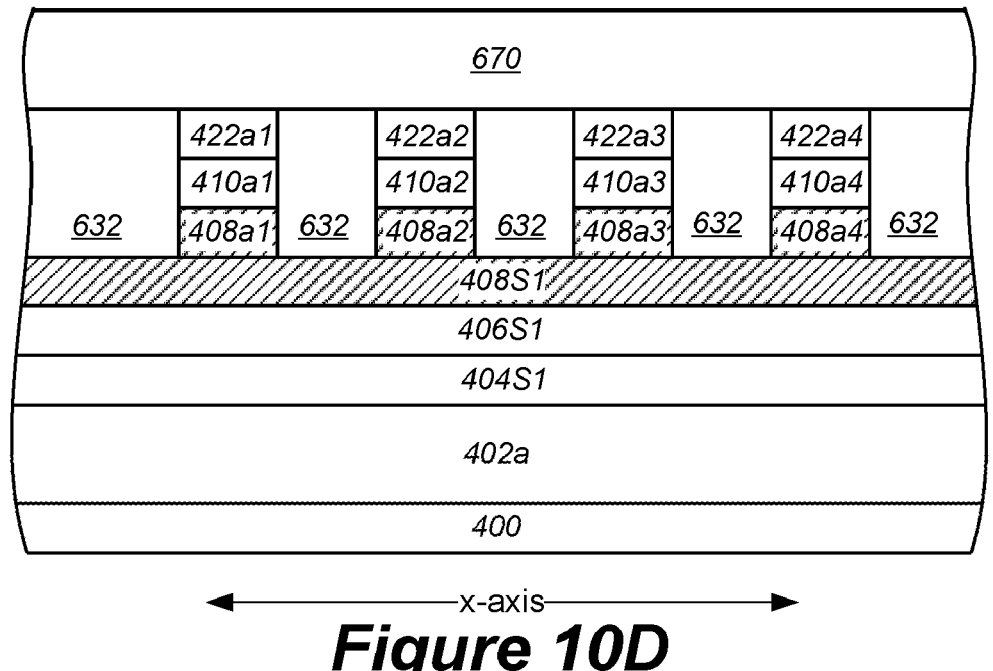
Figure 10E:
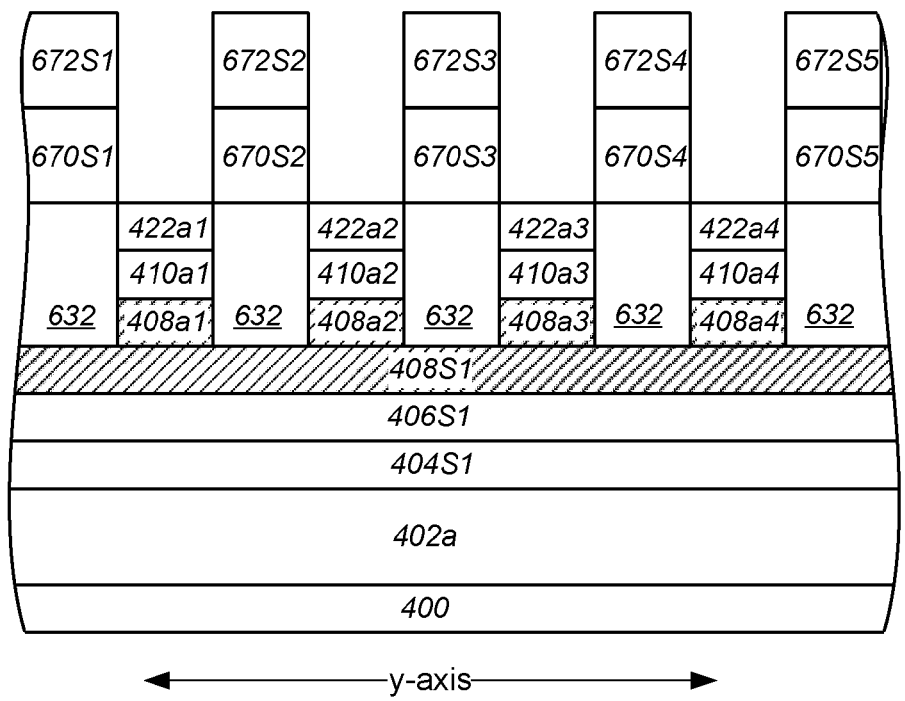

After etching back the gap fill material, a layer of oxide 670 (e.g, TEOS) is deposited over the array as shown in FIG. 10D. A third pattern is then applied over the oxide layer as shown in FIG. 10E. The third pattern can include strips 672S1-672S5 of photoresist in one example that are elongated in the x-direction. In the y-direction, the strips form a repeating pattern, overlying the oxide where it overlies the underlying gap fill material and leaving the oxide exposed at locations where it overlies the underlying pillar structures. After forming the third pattern, the oxide layer 670 is etched into strips 670S1-670S5 elongated in the x-direction as also shown in FIG. 10E. The oxide strips overlie the gap fill material between pillars adjacent in the y-direction. After forming the oxide strips, the photoresist is removed.

Figure 10F:
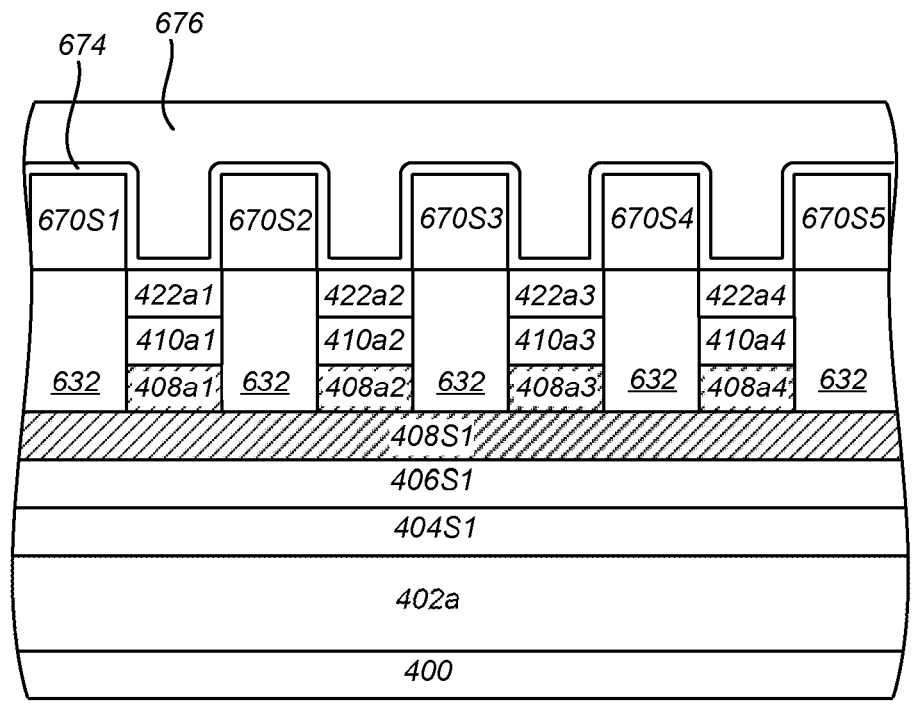
Figure 10G:
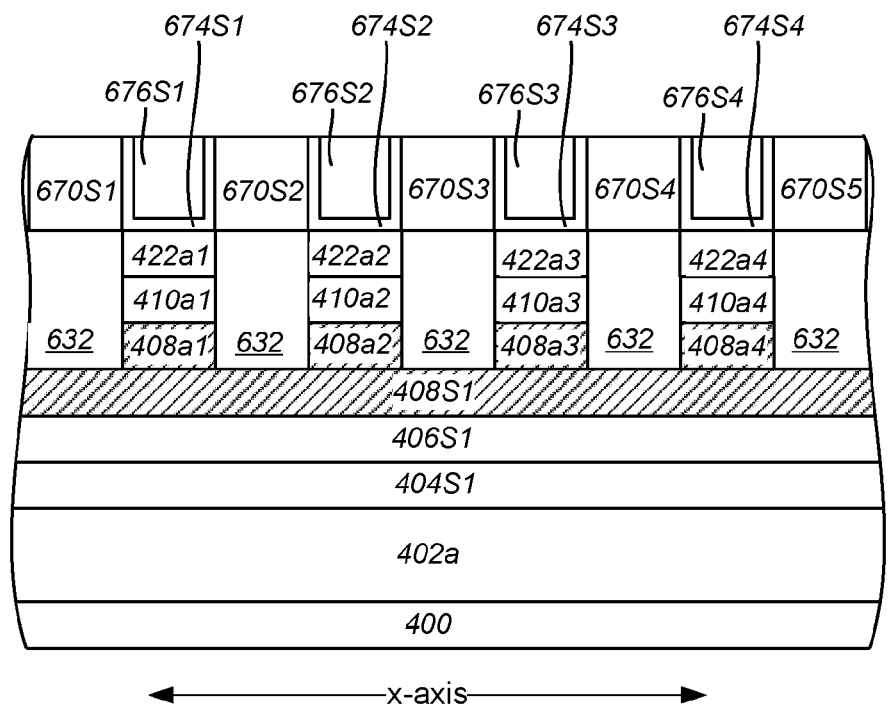
Figure 10H:
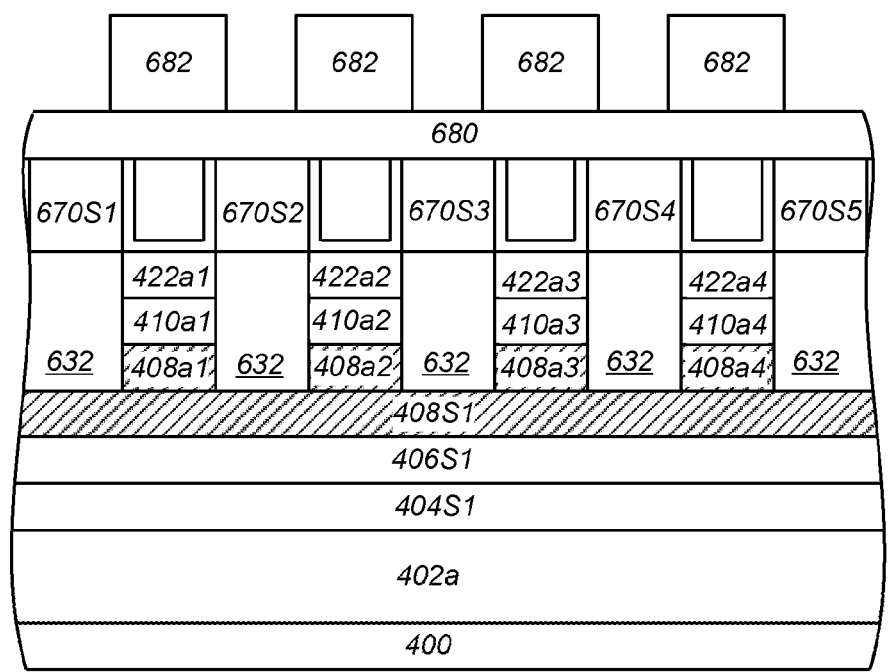
Figure 10I:
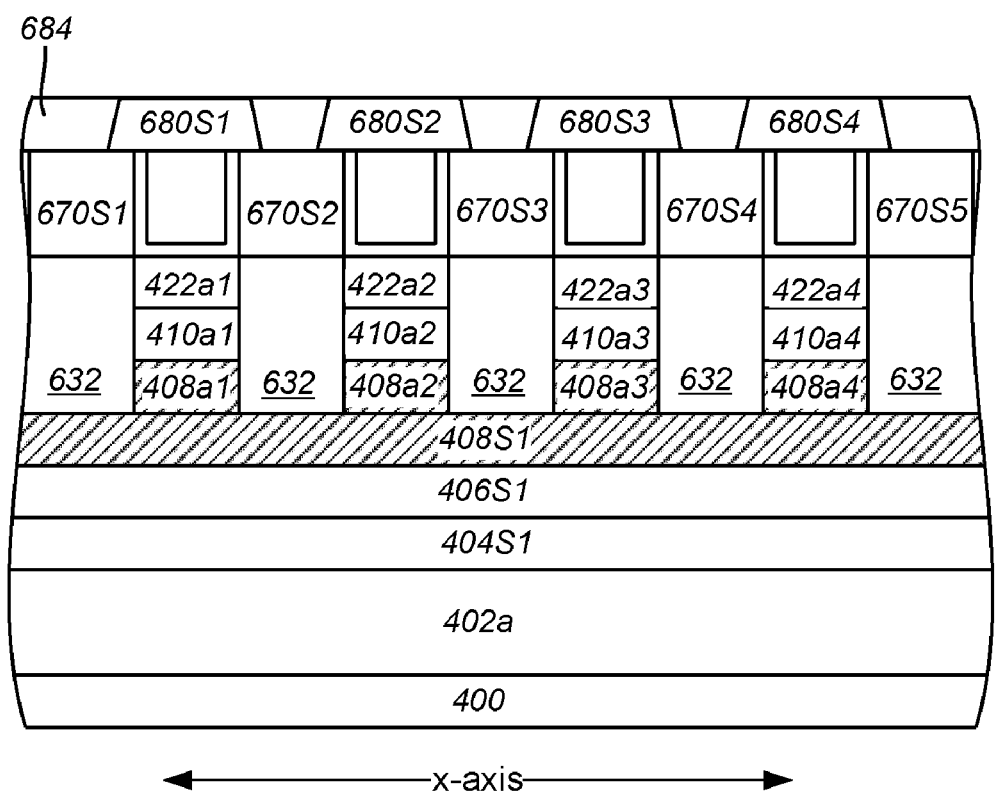

A barrier metal layer 674 (e.g., TaN) is then deposited over the array as shown in FIG. 10F. The barrier metal layer is deposited conformally along the sidewalls of the oxide strips and over the upper surface of the oxide strips and state change material strips. After forming the barrier metal layer, a copper seed is applied, followed by copper electroplating to form a layer 676 of copper. The copper overlies the oxide strips and fills the spaces between strips adjacent in the y-direction. After forming the copper, CMP is used to polish the copper until the upper surface of the oxide strips is reached as shown in FIG. 10G. The CMP process creates individual electrically isolated strips 676S1-676S4 of copper between adjacent strips of oxide. The strips, along with strips 674S1-674S4 of the barrier metal, form the second set of array lines. An additional barrier metal layer 680 is formed over the array as shown in FIG. 10H, followed by application of a pattern 682. This additional metal layer can seal the top of the copper strips and prevent subsequent diffusion of the copper. Barrier metal layer 680 can vary by embodiment and include materials such as TiN or TaN. Using the pattern as a mask, the barrier metal layer is etched into strips 680S1, 680S2, 680S3 and 680S4 as shown in FIG. 10I. Following etching, the pattern is removed, followed by deposition of an oxide 684 to fill the spaces in between strips of the barrier metal layer. The oxide layer is polished using CMP to form a planarized surface as shown in FIG. 10I.

In the preceding embodiments, the pillar structures have a substantially rectangular cross-section and shape as viewed from above. In other embodiments, the pillar structures may have different shapes. For example, the pillars can be substantially cylindrical in other embodiments. It is noted that rectangular features formed with features sizes at certain dimensions (e.g., less than 2500 A in both dimension) using standard photomasking techniques may tend to be substantially cylindrical regardless of the shape of the mask. The semiconductor elements after etch may thus be substantially cylindrical, with a diameter ranging from about 300 to about 2500 A in one exemplary embodiment.

Figure 11A:
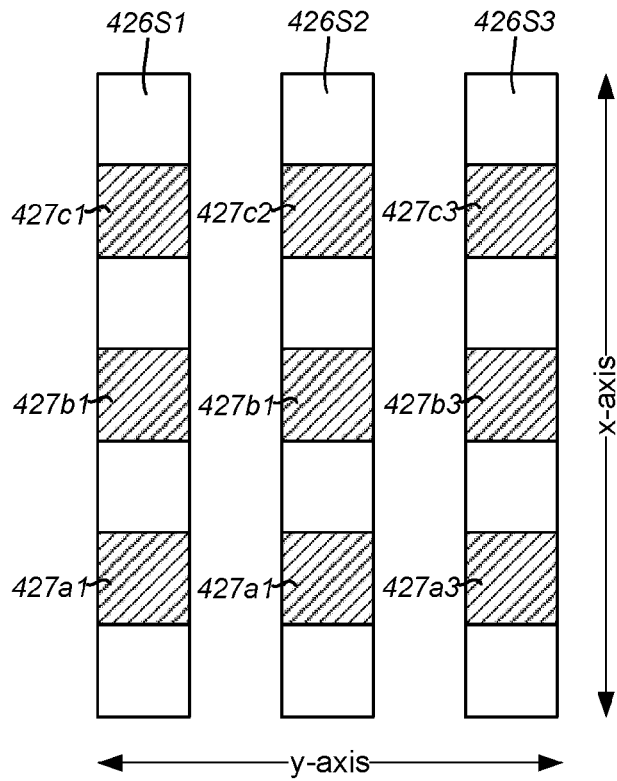
FIGS. 11A-11B are overhead views of a monolithic three-dimensional non-volatile memory illustrating a technique for rounding square or rectangular pillar structures.

In one embodiment, pillars with rectangular cross-sections are formed, then subjected to an oxidation or nitridation process to form a more cylindrical shape. This technique may be useful to avoid diode-to-diode leakage or diode sidewall conduction that could result from sharp diode corners. The oxidation or nitridation process may be applied after etching to form a set of upper electrodes, such as electrodes 426S 1 in FIG. 4L, and before performing a gap fill operation. FIG. 11A is an overhead depiction of the array, corresponding to the view in FIG. 4M. Electrodes 426S1, 426S2 and 426S3 are depicted transparently to illustrate the underlying pillars 427a1, 427b1, 427c1, 427a2, 427b2, 427c2, 427a3, 427b3 and 427c3. It is noted that the described process may be used with any of the described embodiments and not just that of FIGS. 4A-4U. For example, the oxidation or nitridation may also be performed before the gap fill depicted in FIG. 9D or before the gap fill depicted in FIG. 10B.

Figure 11B:
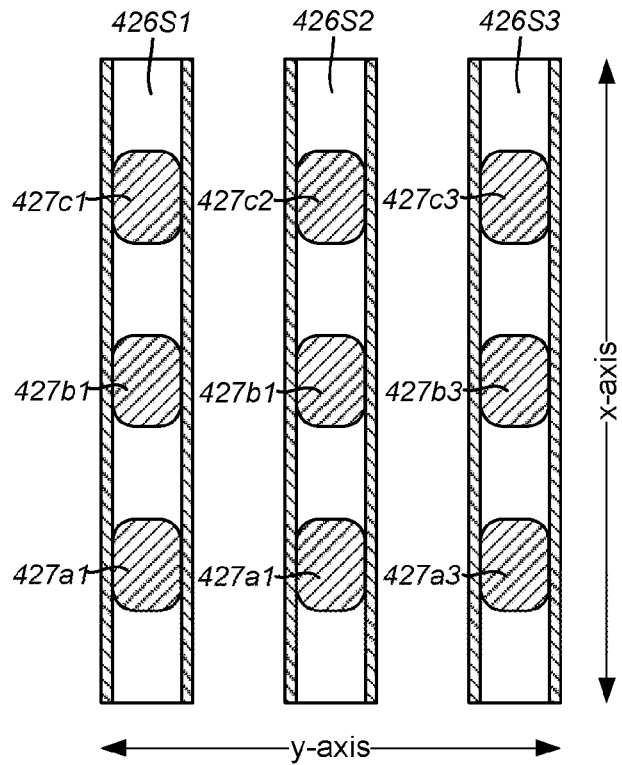

After etching to form the pillar structures, an oxidation process is employed to round-off the corners of the pillars as shown in FIG. 11B. The oxidation process can include a standard thermal oxidation process which will oxidize the corners more rapidly than the sidewalls of the pillars. More advanced oxidation processes can also be used, such as a low thermal-cycle plasma oxidation to achieve a milder rounding effect. The oxidation process has the additional benefit of annealing the pillar sidewalls, which can heal damage that may be induced during the pillar etch processes. The diameter of the pillars may also be decreased as a result of oxidation.

Figure 12:
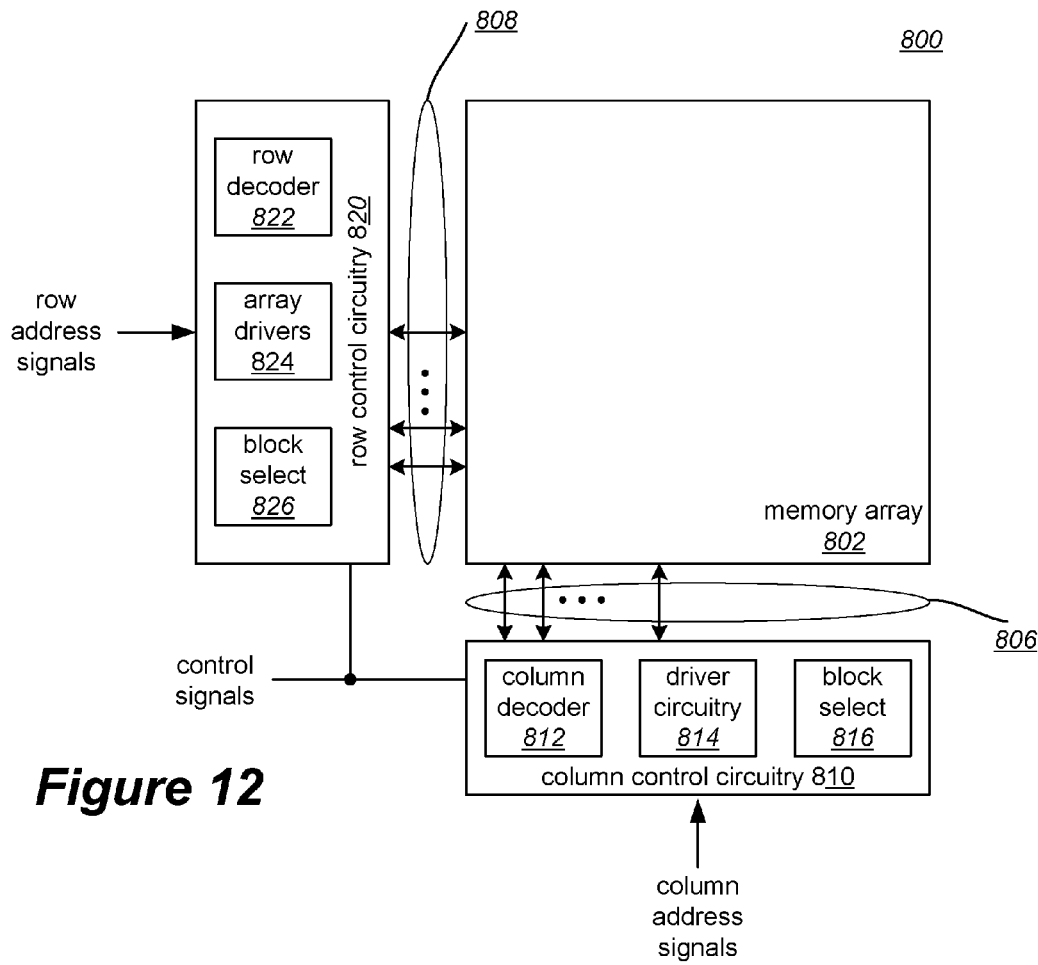
FIG. 12 is a block diagram of a non-volatile memory system.

FIG. 12 is a block diagram of an exemplary integrated circuit including a memory array 802 that may be formed in accordance with the previously described embodiments. The array terminal lines of memory array 802 include the various layer(s) of word lines organized as rows, and the various layer(s) of bit lines organized as columns. The integrated circuit 800 includes row control circuitry 820 whose outputs 808 are connected to respective word lines of the memory array 802. The row control circuitry receives a group of M row address signals and one or more various control signals, and typically may include such circuits as row decoders 822, array terminal drivers 824, and block select circuitry 826 for both read and write (i.e., programming) operations. The integrated circuit 800 also includes column control circuitry 810 whose input/outputs 806 are connected to respective bit lines of the memory array 802. The column control circuitry 806 receives a group of N column address signals and one or more various control signals, and typically may include such circuits as column decoders 812, array terminal receivers or drivers 814, block select circuitry 816, as well as read/write circuitry, and I/O multiplexers. Circuits such as the row control circuitry 820 and the column control circuitry 810 may be collectively termed control circuitry or array terminal circuits for their connection to the various array terminals of the memory array 402.

Exemplary bias conditions for programming a memory cell can include driving a high voltage on an array line corresponding to the anode of the memory cell and driving the other array line to ground. For example, a voltage of 9.5V may be applied in some implementations to breach an antifuse layer for a memory cell. Similar voltages may be applied to change the resistance of a re-writable element during programming. It is possible when programming a selected memory cell to inadvertently program an unselected memory cell, causing program disturb. In implementations where two memory cells share a common diode electrode and part of the intrinsic layer, the bias conditions for programming and sensing can be chosen to minimize the effects of program disturb. With reference to FIG. 4U for example, consider that conductor 402a is a bit line and conductors 443a-443d form word lines. The memory cell in pillar 427a1 may be programmed by driving a high voltage on conductor 402a while grounding conductor 443a. The memory cell in pillar 427a2 may inadvertently be programmed, owing at least partially to the shared intrinsic region 408S1 that is shared by the diodes formed in pillars 427a1 and 427a2.

Figure 13:
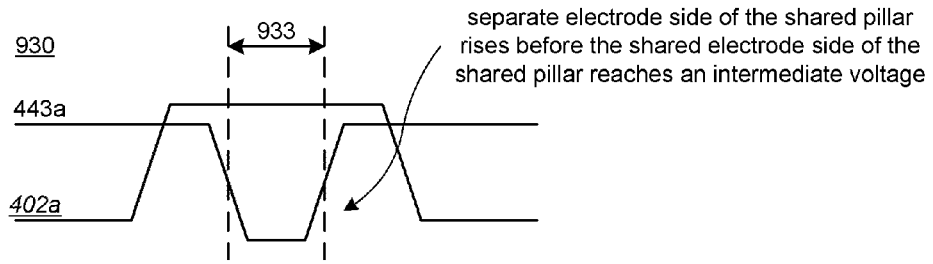
FIG. 13 is a timing diagram for programming a non-volatile memory cell in accordance with one embodiment.

FIG. 13 depicts one programming pulse timing arrangement 930 that may be used to program a memory cell like that in pillar 427a1 when shared diode components are utilized. The bit line initially transitions from its unselected bias level to its selected bias level. Then, the selected word line transitions from its unselected bias level to ground, and returns to the unselected level after a programming pulse time 933. Finally, the selected bit line transitions back to its unselected bias level. As shown, the selected word line pulse falls entirely within the selected bit line pulse, and the separate electrode side of the shared pillar, which could act as an injector to the unselected cell, rises before the shared electrode side of the shared pillar reaches an intermediate voltage. For more information on bias conditions that can be applied, see U.S. Pat. No. 7,022,572, incorporated by reference herein in its entirety. In other embodiments 402a and all the first set of array lines are used as word lines and 443a and all the second set of array lines are used as bit lines.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method of fabricating non-volatile storage, comprising:
    forming over a substrate a first conductor elongated in a first direction, the first conductor having sidewalls elongated in the first direction;
    forming a second conductor elongated in a second direction that is substantially perpendicular to the first direction, the second conductor being vertically-separated from the first conductor and having sidewalls elongated in the second direction, wherein forming the second conductor includes etching a first layer of conductive material into a first strip of conductive material using a first pattern and etching a second layer of conductive material into a second strip of conductive material using a second pattern, the first strip of conductive material forming a first portion of the sidewalls of the second conductor and the second strip of conductive material forming a second portion of the sidewalls of the second conductor;
    forming a third conductor elongated in the first direction, the third conductor being vertically-separated from the first conductor and the second conductor and having sidewalls elongated in the first direction;
    etching a first layer stack using the first pattern to form a first pillar between the first conductor and the second conductor, the first pillar having first sidewalls elongated in the first direction and second sidewalls elongated in the second direction, the first sidewalls of the first pillar being self-aligned with the sidewalls of the first conductor and the second sidewalls of the first pillar being self-aligned with at least the first portion of the sidewalls of the second conductor, the first pillar including a steering element and at least one state change element, wherein etching the first layer of conductive material and the first layer stack using the first pattern defines the second sidewalls of the first pillar and the first portion of the sidewalls of the second conductor; and etching a second layer stack using the second pattern to form a second pillar between the second conductor and the third conductor, the second pillar having first sidewalls elongated in the first direction and second sidewalls elongated in the second direction, the first sidewalls of the second pillar being self-aligned with the sidewalls of the third conductor and the second sidewalls of the second pillar being self-aligned with at least the second portion of the sidewalls of the second conductor, the second pillar including a steering element and at least one state change element, the second portion of the sidewalls of the second conductor being misaligned with the first portion of the sidewalls of the second conductor, wherein etching the second layer of conductive material and the second layer stack using the second pattern defines the second sidewalls of the second pillar and the second portion of the sidewalls of the second conductor.

2. A method according to claim 1, wherein forming the second conductor includes:
depositing a first metal layer and applying a first pattern having repeating features in the first direction;
etching the first metal layer according to the first pattern to define at least the first portion of the sidewalls of the second conductor;
depositing a second metal layer and applying a second pattern having repeating features in the first direction; and
etching the second metal layer according to the second pattern to define the at least a the second portion of the sidewalls of the second conductor.

3. A method according to claim 1, wherein:
the state change element in the first pillar is a diode;
the state change element in the second pillar is a diode;
the at least one state change element in the first pillar is a re-writable phase change element; and
the at least one state change element in the second pillar is a re-writable phase change element.

4. A method according to claim 1, wherein:
the state change element in the first pillar is a diode;
the state change element in the second pillar is a diode;
the at least one state change element in the first pillar is an anti-fuse; and
the at least one state change element in the second pillar is an anti-fuse.

5. A method performed as part of non-volatile memory fabrication, comprising:
forming a first layer stack elongated in a first direction over a substrate, the first layer stack including a first strip of conductive material and a plurality of strips of semiconductor material;
forming a second layer of conductive material over the first layer stack;
etching the second layer of conductive material and the plurality of strips of semiconductor material using a first pattern, said etching includes etching the second layer of conductive material into a second strip of conductive material elongated in a second direction that is substantially orthogonal to the first direction and etching the plurality of strips of semiconductor material into a pillar, the pillar including first sidewalls elongated in the first direction and second sidewalls elongated in the second direction, the second sidewalls being self-aligned with sidewalls of the second strip of conductive material that are elongated in the second direction;

forming a third layer of conductive material over and in electrical contact with the second strip of conductive material after etching the second layer of conductive material and the plurality of strips of semiconductor material;
forming a set of semiconductor layers over the third layer of conductive material; and
etching the set of semiconductor layers and the third layer of conductive material using a second pattern, said etching includes etching the set of semiconductor layers into a second plurality of strips of semiconductor material elongated in the second direction and etching the third layer of conductive material into a third strip of conductive material elongated in the second direction, the third strip of conductive material including sidewalls elongated in the second direction that are self-aligned with sidewalls of the second plurality of strips of semiconductor material that are elongated in the second direction.

6. A method according to claim 5, further comprising:
forming a strip of phase change material over the first layer stack using a damascene process prior to forming the second layer of conductive material;
wherein etching the second layer of conductive material and the plurality of strips of semiconductor material using the first pattern includes etching the strip of phase change material using the first pattern such that the pillar includes a phase change region.

7. A method according to claim 5, wherein:
the set of semiconductor layers is a second set of semiconductor layers;
forming the first layer stack includes:
depositing a first set of semiconductor layers, a first conductive layer, and a state change layer, and
etching, according to a third pattern, the first set of semiconductor layers into the plurality of strips of semiconductor material, the first conductive layer into the first strip of conductive material, and the state change layer into a strip of state change material; and
etching the second layer of conductive material and the plurality of strips of semiconductor material using the first pattern includes etching the strip of state change material such that the pillar includes a phase change region.

8. A method according to claim 5, further comprising:
forming a fourth layer of conductive material over the second plurality of strips of semiconductor material; and
etching the fourth layer of conductive material and the second plurality of strips of semiconductor material using a third pattern, said etching includes etching the fourth layer of conductive material into a fourth strip of conductive material elongated in the first direction and etching the second plurality of strips of semiconductor material into a second pillar, the second pillar including first sidewalls elongated in the first direction and second sidewalls elongated in the second direction, the first sidewalls being self-aligned with sidewalls of the fourth strip of conductive material that are elongated in the first direction, the second sidewalls being self-aligned with the sidewalls of the third strip of conductive material.

9. A method according to claim 5, wherein the pillar includes:
a first semiconductor region of a first conductivity type;
a second semiconductor region of a second conductivity type;
an intrinsic region separating the first semiconductor region from the second semiconductor region, wherein the first semiconductor region, the second semiconductor region and the intrinsic region forming a diode; and
a state change region in series with the diode.

10. A method according to claim 9, wherein:
the state change region is a re-writable resistance change element.

11. A method according to claim 9, wherein:
the state change region is an anti-fuse.

12. A method of fabricating a three-dimensional non-volatile memory system, comprising:
forming a first layer of conductive material;
forming a first set of semiconductor layers over the first layer of conductive material;
etching the first set of semiconductor layers and the first layer of conductive material in a second direction, thereby forming a first plurality of layer stacks elongated in a first direction substantially orthogonal to the second direction, the first plurality of layer stacks including a first set of conductors formed from the first layer of conductive material;
forming a second layer of conductive material over the plurality of layer stacks;
etching the second layer of conductive material and the first plurality of layer stacks in the first direction, thereby forming a first plurality of pillars from the first set of semiconductor layers in each layer stack and a plurality of strips of the second layer of conductive material, the plurality of strips elongated in the second direction;
forming a third layer of conductive material over the plurality of strips of the second layer of conductive material;
forming a second set of semiconductor layers over the third layer of conductive material; and
etching the second set of semiconductor layers and the third layer of conductive material in the first direction, thereby forming a second plurality of layer stacks elongated in the second direction, the second plurality of layer stacks including a plurality of strips of the third layer of conductive material elongated in the second direction, the plurality of strips of the third layer of conductive material and the plurality of strips of the second layer of conductive material being electrically connected to form a second set of conductors elongated in the second direction.

13. A method according to claim 12, wherein:
each pillar of the first plurality of pillars includes a diode and a state change element;
etching the first plurality of layers stacks includes etching less than all the layers in each layer stack, each layer stack including a first strip of semiconductor material forming a first electrode for the diode in each pillar of the first plurality of pillars and a second strip of semiconductor material forming at least a portion of an intrinsic region for the diode in each pillar; and
the method further comprising programming the state change element in a particular pillar by transitioning a corresponding conductor in the first set of conductors to its selected bias level prior to transitioning a corresponding conductor in the second set of conductors to its selected bias level and transitioning the corresponding conductor in the second of conductors back to its unselected bias level prior to transitioning the corresponding conductor in the first set of conductor back to is unselected bias level.

14. A method according to claim 12, wherein the first plurality of layer stacks include sacrificial strips over their upper surface, the method further comprising:

depositing an insulating material in spaces between layer stacks of the first plurality adjacent in the second direction;
removing the sacrificial strips;
slimming portions of the insulating material at a vertical height above the first plurality of layer stacks; and
depositing a phase change material in spaces between the slimmed portions of the insulating material.

15. A method according to claim 12, wherein the first set of semiconductor layers includes a layer of phase change material.

16. A method according to claim 12, further comprising:
forming a fourth layer of conductive material over the second plurality of layer stacks; and
etching the fourth layer of conductive material and the second plurality of layer stacks in the second direction, thereby forming a second plurality of pillars from the second set of semiconductor layers in each layer stack of the second plurality and a plurality of strips of the fourth layer of conductive material, the plurality of strips of the fourth layer of conductive material elongated in the first direction.

17. A method according to claim 15, wherein the first set of semiconductor layers includes:
a first semiconductor layer of a first conductivity type;
a second semiconductor layer of a second conductivity type; and
an intrinsic layer separating the first semiconductor layer from the second semiconductor layer.

18. A method according to claim 17, wherein each pillar in the first plurality includes:
a diode having a first electrode formed from the first semiconductor layer and a second electrode formed from the second semiconductor layer; and
a state change element formed from the layer of phase change material, the state change element in series with the diode.

19. A method of non-volatile memory fabrication, comprising:
forming a first set of conductors elongated in a first direction over a substrate;
forming a first set of semiconductor layer stack lines over the first set of conductors;
forming a first layer of silicon over the first set of semiconductor layer stack lines;
etching the first layer of silicon and the first set of semiconductor layer stack lines according to a first pattern, said etching forming from the first layer of silicon a second set of conductors elongated in a second direction substantially orthogonal to the first direction, said etching forming from the first set of semiconductor layer stack lines a first plurality of pillars at intersections of the first set of conductors and the second set of conductors;
silicidizing the second set of conductors after etching the first layer of silicon to form silicide conductors for the second set;
forming a second semiconductor layer stack over the second set of conductors after silicidizing; and
etching the second semiconductor layer stack according to a second pattern to form a second set of semiconductor layer stack lines elongated in the second direction, the first pattern and the second pattern having repeating features in the first direction.

20. A method according to claim 19, further comprising:
forming a second layer of silicon over the second set of semiconductor layer stack lines; and etching the second layer of silicon and the second set of semiconductor layer stack lines according to a third pattern having repeating features in the second direction, said etching forming from the second layer of silicon a third set of conductors elongated in the first direction and forming from the second set of semiconductor layer stack lines a second plurality of pillars at intersections of the second set of conductors and the first set of conductors.

21. A method according to claim 19, wherein silicidizing the first layer of silicon comprises:
forming a surface layer of metal on the first set of conductors; and
thermally annealing the surface layer of metal and the first set of conductors to form silicide conductors for the first set.

* * * * *